Sept. 1, 1959 E. L. MARTIN 2,902,365

PHOTOPOLYMERIZABLE COMPOSITIONS AND ELEMENTS AND PROCESS OF MAKING RELIEFS THEREFROM

Filed Aug. 14, 1956 3 Sheets-Sheet 1

INVENTOR

ELMORE LOUIS MARTIN

BY Lynn Barratt Morris

ATTORNEY

INVENTOR
ELMORE LOUIS MARTIN

BY Lynn Barratt Morris
ATTORNEY

*INVENTOR*
ELMORE LOUIS MARTIN

BY Lynn Barratt Morris
*ATTORNEY*

2,902,365

PHOTOPOLYMERIZABLE COMPOSITIONS AND ELEMENTS AND PROCESS OF MAKING RELIEFS THEREFROM

Elmore Louis Martin, Wilmington, Del., assignor to E. I. du Pont de Nemours and Company, Wilmington, Del., a corporation of Delaware Application August 14, 1956, Serial No. 604,006

17 Claims. (Cl. 96—35)

This invention relates to new polymeric compositions, and more particularly to photosensitive, addition polymerizable, ethylenically unsaturated polymeric compositions which are soluble in aqueous solutions and particularly in basic solutions. It also relates to photopolymerizable elements, e.g., plates embodying a layer of such compositions, and to processes of making printing reliefs from such elements and to the printing reliefs.

Solid compositions capable of polymerization under the influence of actinic light to give rigid, insoluble, tough structures have recently become of increased technical importance, especially in making printing reliefs, as described and claimed in Belgian Patent 525,225 and British Patents 741,441 and 741,470 and in the copending application of Plambeck S. N. 326,841, filed December 12, 1952 (U.S. 2,760,863, Aug. 28, 1956). In the process of this latter application, printing plates with uniform printing height are produced directly by exposing to actinic light through an image-bearing process transparency a layer of an essentially transparent, addition-polymerizable, ethylenically unsaturated composition containing intimately dispersed therethrough an addition polymerization initiator activatable by actinic light, said layer being superposed on and adherent to a suitable support, until substantially complete polymerization of the composition occurs in the exposed areas with substantially no polymerization occurring in the non-exposed areas. Removal of the layer in the latter areas, e.g., by treatment with a suitable solvent in which the substantially fully polymerized composition in the exposed area is insoluble, leaves a raised relief image of the text of the transparency suitable for direct use as a printing plate, especially for letterpress and dry offset work.

Solid photopolymerizable layers including some which are soluble in water and aqueous alkaline solutions are disclosed in the aforesaid patents and applications and in Plambeck Ser. No. 541,723 filed Oct. 20, 1955 (U.S. 2,791,504, May 7, 1957), a division of Ser. No. 326,841 Patent No. 2,760,863.

An object of this invention is to provide new photopolymerizable compositions which can be used to form non-tacky layers which are soluble in water or dilute aqueous alkaline solutions. Another object is to provide such compositions which can be readily photopolymerized to addition polymers which are insoluble in aqueous solutions. A further object is to provide such compositions that contain economical constituents which are ready soluble in the aforesaid solutions. A still further object is to provide photopolymerizable elements having layers of the aforesaid compositions which can be exposed and developed with simple aqueous processing solutions and thus obviate volatile solvent recovery problems and health hazards which are presented by the use of organic solvents as developing solutions. A still further object is to provide a printing relief which is hard, tough, non-tacky and has a long press life. Still other objects will be apparent from the following description.

The novel photopolymerizable compositions of this invention comprise: (1) a substantial amount of an addition polymerizable, ethylenically unsaturated component, i.e., an ethylenically unsaturated monomer or polymer, or a mixture of such monomers and/or polymers; (2) a substantial amount of a polyvinyl alcohol derivative containing lateral free acid (e.g., oxyacid) groups, or their soluble salts, more particularly the alkali metal, ammonium, or substituted ammonium or amine salts, which derivative is soluble to the extent of at least 10% by weight in 2% aqueous ammonia solution; and (3) initiating amounts of an addition polymerization initiator activatable by actinic light. The compositions can contain up to 40% by weight of an inert organic or inorganic filler material.

The aforedescribed compositions can be readily coated cast or extruded onto suitable supports to form photopolymerizable elements. Thus an aqueous or organic solvent solution or dispersion of the composition, with or without an added plasticizer, can be formed into a suitable layer by means of conventional coating, casting, extrusion and calendering apparatus. The resulting layers are non-tacky and yet are readily soluble in water or an aqueous alkaline or base solution.

Upon exposure to actinic light of selected areas of a photopolymerizable layer of an aforesaid composition, for example by exposure through a stencil or a process transparency having transparent areas and opaque areas, until polymerization is essentially complete, i.e., to the insoluble state throughout the entire light-exposed thickness of the layer, and removal of the unexposed portions of the layer with water or an aqueous base, a sharp tough relief image is obtained. Printing reliefs can be made in this manner with photo-polymerizable layers 3 to 250 mils in thickness and by means of the apparatus and more detailed procedures of the above-identified applications and foreign patent specifications.

In a more limited sense, the ethlyenically unsaturated constituent (1) is generally present in an amount from 10% to 60%, constituent (2) in an amount from 40% to 90%, and any inert filler material in an amount up to 40%, all said percentages being by weight of the total composition exclusive of initiator which latter is present in an amount of from 0.01% to 5.0% based on constituent (1). The filler material can be compatible polymer, an inorganic compound, a low molecular weight plasticizer, or other material which will give desirable modifications to the rheological properties of the compositions and influence the physical properties of the resulting sheets.

The invention also includes elements suitable for the preparation of printing relief images comprising an adherent support having superposed thereon a solid layer of the just-described photopolymerizable compositions from 3 to 250 mils in thickness. In a preferred embodiment these elements comprise sheet or plate supports from which no more than 35% of incident actinic light is reflected. When the support material is light-reflective, e.g., metal plates or sheets or foils which are preferred because of their strength and other inherent physical properties, there is present, e.g., superposed on said support and adherent thereto or in the surface thereof, a layer or stratum absorptive of actinic light so as to restrict reflectance from the combined support of again no more than 35% of incident actinic light. Photopolymerizable elements of this general structure are the subject matter of copending Plambeck application U.S. Ser. No. 541,723, filed October 20, 1955 (U.S. 2,791,504, May 7, 1957).

The various components of the new compositions of this invention must be carefully selected. The solid oxyacid substituted polyvinyl alcohol component or salt thereof, which can comprise one or more such derivatives, will have the lateral oxyacid substituents or the above-described salts thereof linked to the main polymer chain through ester and/or ether oxygen, the latter including acetal oxygen. Thus, the acidic polyvinyl alcohol components are solid polyvinyl alcohol esters, ethers, and/or ester/ethers including acetals with free acid groups in the ester, ether, and/or ester/ether substituents in amount sufficient to render the said components base-soluble, i.e., soluble to the extent of at least 10% in excess 2% aqueous ammonia solution. The acidic polyvinyl alcohol component which generally is a mixture of compounds of different molecular weights exhibits a neutral equivalent from about 115 to about 2500, and preferably from about 200 to about 1400.

In the case of the strongly acidic substituents, e.g., the sulfonates, i.e., in those instances where the polyvinyl alcohol chain carries lateral substituents which in uncombined form exhibit $pK_a$ values less than about 3.0, the acid groups are preferably handled in their salt form. The structure is the same as the above with sufficient salt groups to render the polymers soluble in water to the extent of at least 10% by weight. In the case of the weaker acids, e.g., the carboxylic acids, the free acid form is preferably used.

The lateral free acid groups are generally those wherein the acidic hydrogen is linked to the remainder of the molecule through oxygen. This expressly includes both carboxylic and sulfonic acid groups, with the former preferred because of the availability of the necessary intermediates and the ease with which such substituents are introduced into the polyvinyl alcohol molecule.

The second component of the new compositions of this invention, the low molecular weight, addition polymerizable component, must likewise be carefully selected and can comprise one or more such compounds, preferably containing a plurality of addition polymerizable ethylenic linkages. This component must be present in only carefully selected concentrations ranging from 10–60% by weight of the total composition and preferably ranging from 20 to about 40% by weight of the whole composition.

Not only is the concentration of this component critical, but so is the chemical and physical nature thereof. In the first place, since the new compositions overall should be substantially transparent to the actinic light (although slight haze can be tolerated) the low molecular weight polymerizable components must be compatible with and preferably show some plasticizing action for the acidic polyvinyl alcohol derivative containing the lateral free acid or salt groups. Generally speaking, the overall composition including the photoinitiator, must exhibit an optical density to the actinic light of less than 0.5 per mil and less than 5.0 in photopolymerizable layer form.

The low molecular weight, addition polymerizable component must also exhibit a normal boiling point greater than 100° C. at atmospheric pressure. It can vary in molecular weight from about 100 to about 1500 but must contain at least one addition polymerizable ethylenic linkage for about every 300 units of molecular weight. The preferred low molecular weight addition polymerizable components are those of molecular weight 150 to about 500 containing at least one addition polymerizable ethylenic linkage for every 100–250 units of molecular weight.

The photoinitiator component, i.e., addition polymerization initiator activatable by actinic light, must be soluble in the overall composition or capable of substantially uniform distribution therethrough. Many such compounds are known and are listed in the foregoing patents and applications, and any or all of them can be used singly or admixed in the present compositions. The photoinitiators are generally present in the compositions in amounts ranging from about 0.01% up to about 5.0%, with preferred quantities lying in the range of 0.1 to 2.0%, based on the polymerizable component.

For convenience, reference has been made and will be made later to the polymeric components of these new compositions as being acidic polyvinyl alcohol derivatives, including also the aforesaid water-soluble alkali metal, ammonium, and substituted ammonium salts thereof. It will be understood that the term "polyvinyl alcohol" refers broadly to a polymer having a molecular weight of 10,000 to 100,000 or more and having a wholly carbon main chain containing a plurality of polymerized, i.e., combined, vinyl alcohol —$CH_2CHOH$—, units intralinear to the polymer chain, whether or not the polymer is polyvinyl alcohol itself or one of a number of related polymers. Thus, in the polyethers and/or polyesters defined above the alcohol portion of the molecule is a hydroxyl polymer or copolymer containing a large number of intralinear —$CH_2CHOH$-groups. Such a polymer can be, for example, polyvinyl alcohol itself, i.e., a substantially completely hydrolyzed polyvinyl carboxylate; or it may be a partially hydrolyzed polymer or copolymer with other monomers of a vinyl carboxylate, particularly a vinyl ester of a monocarboxylic acid of one to four carbon atoms, e.g., vinyl formate, vinyl acetate, vinylchloroacetate, vinyl propionate, vinyl butyrate, etc. The vinyl carboxylates should generally be sufficiently hydrolyzed so that the —$CH_2CHOH$-groups represent at least 50% of the polymer chain, i.e., for every 100 chain atoms there are at least 25 hydroxyl groups. Hydrolyzed copolymers of vinyl esters with minor combined proportions (i.e., less than 50% by weight) of other polymerizable vinyl compounds, e.g., N-vinylphthalimide, styrene, butadiene, vinyl fluoride, N-vinyl-N-methylformamide, allyl glycidyl ether, methyl vinyl ether, ethyl vinyl ether, benzyl vinyl ether, N-vinyl pyrrolidone, N-vinylcaprolactam, etc., are suitable. In particular, the hydrolyzed olefin/vinyl ester copolymers and especially the hydrolyzed ethylene/vinyl acetate copolymers described in U.S. Patents 2,386,347 and 2,397,866 are useful.

These various polyvinyl acetals and/or esters can be prepared by known procedures. For instance, the introduction of the desired acetal component, whether it be the saturated or unsaturated type, is conveniently achieved by reacting a polyvinyl alcohol with the appropriate aldehyde or preferably with a monomeric, i.e., simple, acetal thereof, until acetalization of the hydroxyl groups has proceeded to the desired extent.

The monoethers can be prepared in like manner by using alcohols or ether-forming derivatives thereof in place of the aldehydes. The single ether substituents, whether neutral or acidic, can also be incorporated in the polymer by use of the corresponding vinyl monomer in the initial formation of the polymer.

When it is desired to introduce ester groups, whether of saturated or unsaturated type, the reaction can be carried out by direct acylation of the polyvinyl alcohol with the appropriate acid, anhydride, halide, or the like, until the required degree of esterification is achieved.

It is also within the scope of these preparative procedures to prepare those products containing mixed ester and acetal groups by carrying out the acetalization reaction, for instance, in a solvent medium which consists of or comprises the requisite carboxylic acid desired for the esterification; or conversely the esterification with the requisite carboxylic acid, anhydride, or reactive derivative thereof can be carried out using the requisite aldehyde as solvent medium. In other words, the mixed products can be prepared by simultaneous or separate acetalization and/or esterification with the appropriate saturated and/or unsaturated aldehyde or acid derivative.

These various operations involve conventional etherification, acetalization and acylation procedures, catalysts, and conditions which need not be discussed further here since they are well recognized in the art and form no part of the present invention.

In the attached drawings which constitute a part of this application:

Fig. 1 is a triangular graph in weight percent of the interrelated variables of the polyvinyl alcohol derivatives, i.e., the relative amounts of combined vinyl units with acidic groups, neutral groups and free hydroxyl groups useful in the compositions and processes of the invention. The numbered points correspond to the so-numbered entries in Table II below, or in the numbered sections in column 16, line 27, thru column 20, line 62.

Figure 1:
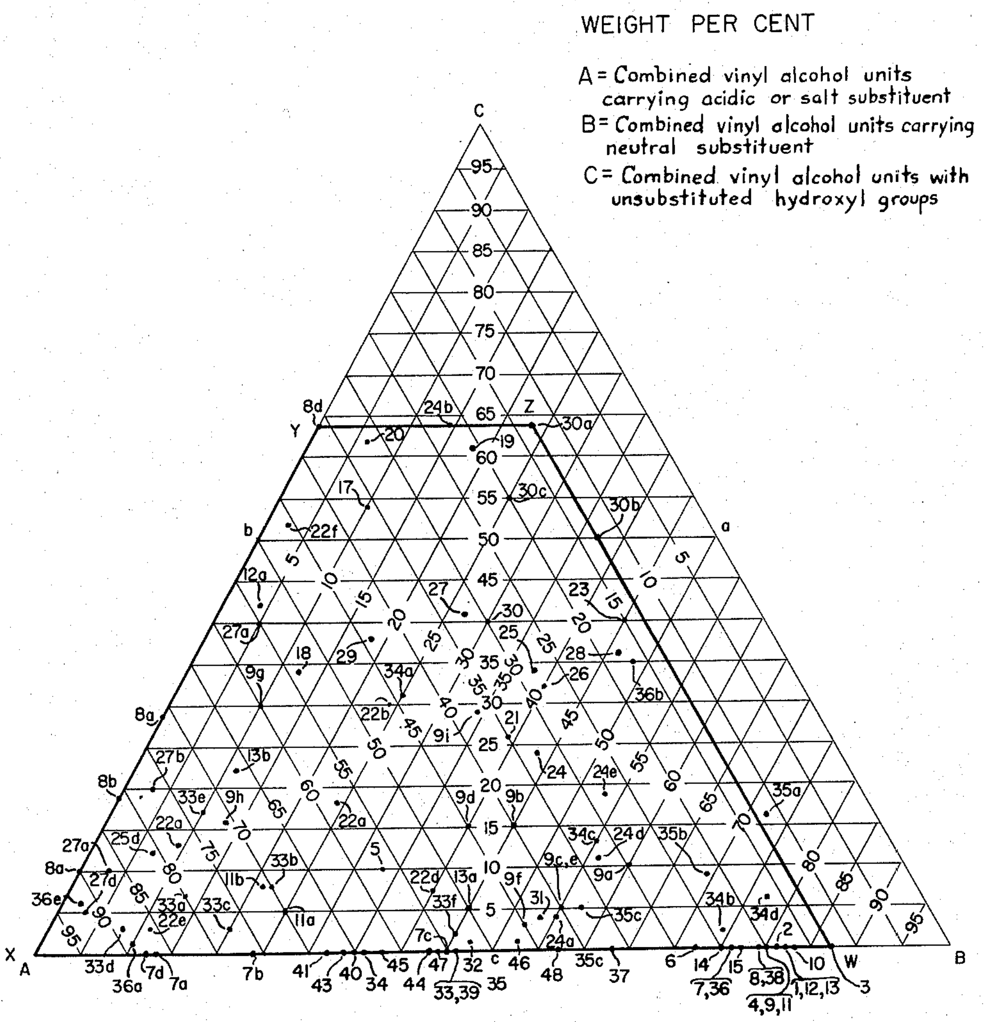

The foregoing figures of the drawing are self-explanatory and, therefore, to avoid unnecessary repetition, no further explanation is included in the text of the specification. The cross-sectional views are schematic and do not represent exact proportional dimensions of the layers and support.

This invention is illustrated in greater detail by the following examples in which the parts are by weight. These examples include some preferred compositions of this invention and the use of the photopolymerizable elements wherein the compositions are carried on a suitable support in the preparation of printing plates. Also illustrated in these examples is the importance of the above-mentioned numerical limits.

EXAMPLE I

*Part A.—Preparation of a polyvinyl acetate/acrylal/(sodio o-sulfo)benzal*

A mixture of about 125 parts of glacial acetic acid, 6 parts of trifluoroacetic acid, 0.1 part of hydroquinone, 10 parts of (sodio o-sulfo)benzaldehyde dihydrate, 2.8 parts of acrolein, and 30 parts of an 86–89% hydrolyzed polyvinyl acetate (i.e., an 86–89/14–11 polyvinyl alcohol/acetate) exhibiting a viscosity of 4 to 6 centipoises in 4% water solution at 20° C. was stirred at 73–75° C. for 15 minutes during which time a homogeneous solution was obtained. To the resultant solution there was added about 50 parts of acetic anhydride and the reaction mixture then stirred for an additional 15 minutes at 72–74° C. The resultant polyvinyl acetate/acrylal/(sodio o-sulfo)benzal was precipitated by the addition of a mixture of diethyl ether and petroleum ether until no further polymer precipitated. The solvents were decanted from the crude polymer and the heavy, gummy mass washed with diethyl ether. The crude polyvinyl ester/acetal was dissolved in a five to one mixture of methylene chloride and methanol. The precipitation and resolution processes were repeated thrice more with 0.004 part of hydroquinone stabilizer being added during the last solution process. There was thus obtained 140 parts of a solution (23.8% solids) of the pure 74/6/20 polyvinyl acetate/acrylal/(sodio o-sulfo)benzal, exhibiting a neutral equivalent of 1350.

*Part B.—Preparation of a polyvinyl acetate/acrylal/(sodio o-sulfo)benzal-based printing relief*

To 45 parts of the above solution (containing 10.7 parts of the solid, 74/6/20 polyvinyl acetate/acrylal/(sodio o-sulfo)benzal) there was added 3.2 parts (23% of the whole on a solids basis) of the bis-methacrylate ester of a polyethylene glycol having an average molecular weight of 200 and 0.12 part of benzoin methyl ether. The resulting solution was cast (about 30 to 40 mils thick) on a glass plate and the solvents allowed to evaporate at room temperature in subdued light. The resulting solid transparent film (about 10 to 15 mils thick) of the polyvinyl ester acetal/bis-methacrylate/initiator/stabilizer composition adhered tenaciously to the glass base-plate. A line process negative carrying a letter text in clear areas on a dark background was placed on the upper surface of the dry, firm, photopolymerizable layer. The resulting assembly including the glass base-plate was placed on a black antihalation background and exposed for a period of 20 minutes, while rotating on a turntable at about 4 r.p.m., to the light from four 275-watt mercury vapor sunlamps arranged at a distance of 12 to 14 inches. After removal of the negative, the material in the unexposed and thus unchanged areas of the organic film under the dark areas in the negative, i.e., the unchanged 74/6/20 polyvinyl acetate/acrylal/(sodio o-sulfo)benzal, polyethylene glycol dimethacrylate, benzoin methyl ether, hydroquinone composition was removed by washing in 25–30° C. water for 2 to 3 minutes. There was thus obtained a mechanically strong, printable, scratch-resistant, raised relief image of the letter text in the clear areas of the negative exhibiting excellent sharpness and fidelity with deep recess areas.

In the same general manner as described in Example I, Part A, other acidic polyvinyl alcohol ester, acetal, and/or ester/acetals were prepared as outlined in the following Table I. Some variations were used in the nature and amounts of the reaction medium as well as in the reaction temperature, neither of which factors is critical. In general, the starting polyvinyl alcohol ester and/or acetal or unsubstituted polyvinyl alcohol was esterified and/or acetalized in solution in an inert diluent, such as acetic acid, acetone/alcohol mixtures, dioxane/alcohol mixtures, with or without added water. In those instances where more than one substituent group is introduced on the parent polyvinyl alcohol chain, i.e., including both different ester linkages and/or ester and acetal linkages, the reaction can be carried out stepwise with the first derivative being separately isolated and purified and subsequently further reacted with the added necessary aldehyde and/or ester-forming reactant. Alternatively the final product can be prepared directly by using a mixture of all the necessary ester and/or acetal-forming reactants. Conventional esterification and acetal-forming catalysts such as the strong organic acids, e.g., trifluoroacetic acid in the case of the acetals, will be used. The strong organic bases, e.g., triethylamine, are useful for the preparation of the esters using the organic acid anhydrides. The reaction times necessary are not critical and may vary from about 30 minutes to about 2 hours or so. The reaction temperatures likewise are not critical and may vary from about 65° C. to about 100° C. The variables mentioned above are known to be useful in the art for the synthesis of polyvinyl alcohol ester, acetal, and/or ester/acetal derivatives.

In Tables I and II below, the following self-explanatory abbreviations have been used:

PVA=polyvinyl alcohol
Ac=acetate
SOSB=(sodio o-sulfo)benzaldehyde and in combined polymer nomenclature=(sodio o-sulfo)benzal
POSB=(potassio sulfo)benzaldehyde and in combined polymer nomenclature=(potassio o-sulfo)benzal
EGMAB=ethylene glycol m-methacrylamidobenzaldehyde acetal, i.e., ethylene m-methacrylamidobenzal
MAB=m-methacrylamidobenzaldehyde and in combined polymer nomenclature=m-methacrylamidobenzal
CPA=p-carboxyphenoxyacetaldehyde and in combined polymer nomenclature=p-carboxyphenoxyacetal
AcA=acetic anhydride
Ca="carbic" anhydride, i.e., bicyclo [2,2,1]hept-5-ene-2,3-dicarboxylic acid anhydride

TABLE I

| No. | Parts | Starting Polymer | Parts | Reactant | Parts | Reactant | Parts | Reactant | Product | N.E. | S.E. |
|---|---|---|---|---|---|---|---|---|---|---|---|
| 1 | 30.0 | 86-89/14-11 PVA/Ac | 10.0 | SOSB.2$H_2O$ | 1.4 | Acrolein | 50.0 | AcA | 77.0/5.0/18.0 PVAc/acrylal/SOSB | 1,560 | |
| 2 | 30.0 | 86-89/14-11 PVA/Ac | 10.0 | SOSB.2$H_2O$ | 10.0 | EGMAB | 50.0 | AcA | 63.0/18.0/19.0 PVAc/MAB/SOSB | 1,470 | |
| 3 | 30.0 | 86-89/14-11 PVA/Ac | 6.1 | SOSB.2$H_2O$ | 1.5 | Acrolein | 50.0 | AcA* | 57.0/24.0/6.0/13.0 PVAc/benzal/acrylal/ SOSB | 2,160 | |
| 4 | 30.0 | 86-89/14-11 PVA/Ac | 9.8 | SOSB.2$H_2O$ | 1.5 | do | 50.0 | AcA* | 50.0/24.0/6.0/20.0 PVAc/benzal/acrylal/ SOSB | 1,370 | |
| 5 | 20.0 | 86-89/14-11 PVA/Ac | 18.0 | CPA | 4.0 | do | 10.0 | AcA | 10.0/12.0/21.0/57.0 PVA/Ac/acrylal/CPA | 440 | |
| 6 | 30.0 | 86-89/14-11 PVA/Ac | 10.8 | CPA | 12.7 | Benzaldehyde | 50.0 | AcA | 36.0/36.0/28.0 PVAc/benzal/CPA | 970 | |
| 7 | 30.0 | 86-89/14-11 PVA/Ac | 12.2 | SOSB.2$H_2O$ | 12.7 | do | 50.0 | AcA | 40.0/36.0/24.0 PVAc/benzal/SOSB | 1,160 | |
| 8 | 30.0 | 86-89/14-11 PVA/Ac | 10.5 | SOSB.2$H_2O$ | 12.7 | do | 50.0 | AcA | 42.0/37.0/21.0 PVAc/benzal/SOSB | 1,280 | |
| 9 | 30.0 | 86-89/14-11 PVA/Ac | 9.8 | SOSB.2$H_2O$ | 12.7 | do | 50.0 | AcA | 44.0/36.0/20.0 PVAc/benzal/SOSB | 1,450 | |
| 10 | 30.0 | 86-89/14-11 PVA/Ac | 8.5 | SOSB.2$H_2O$ | 12.7 | do | 50.0 | AcA | 46.0/37.0/17.0 PVAc/benzal/SOSB | 1,610 | |
| 11 | 30.0 | 86-89/14-11 PVA/Ac | 7.3 | SOSB.2$H_2O$ | 12.7 | do | 50.0 | AcA | 47.0/38.0/15.0 PVAc/benzal/SOSB | 1,870 | |
| 12 | 30.0 | 86-89/14-11 PVA/Ac | 6.1 | SOSB.2$H_2O$ | 12.7 | do | 50.0 | AcA | 49.0/38.0/13.0 PVAc/benzal/SOSB | 2,220 | |
| 13 | 30.0 | 86-89/14-11 PVA/Ac | 7.8 | POSB | 12.7 | do | 50.0 | AcA | 45.0/37.0/18.0 PVAc/benzal/POSB | 1,630 | |
| 14 | 30.0 | 86-89/14-11 PVA/Ac | 11.2 | POSB | 12.7 | do | 50.0 | AcA | 39.0/36.0/25.0 PVAc/benzal/POSB | 1,180 | |
| 15 | 30.0 | 86-89/14-11 PVA/Ac | 11.0 | SOSB.2$H_2O$ | 8.6 | n-Butyraldehyde. | 50.0 | AcA | 45.0/32.0/23.0 PVAc/butyral/SOSB | 1,190 | |
| 16 | 50.0 | 86-89/14-11 PVA/Ac | 20.0 | MA | 25.0 | SA | | | 47.2/15.8/16.4/20.6 PVA/Ac/HM/HS | 385 | 142 |
| 17 | 25.0 | 86-89/14-11 PVA/Ac | 25.0 | DSA | | | | | 54.3/9.5/36.2 PVA/Ac/HDS | 855 | 292 |
| 18 | 30.0 | 86-89/14-11 PVA/Ac | 20.0 | MA | 30.0 | SA | | | 34.0/12.0/22.0/32.0 PVA/Ac/HM/HS | 262 | 111 |
| 19 | 25.0 | 86-89/14-11 PVA/Ac | 15.0 | MA | | | | | 60.7/18.0/21.3 PVA/Ac/HM | 568 | 196 |
| 20 | 50.0 | 86-89/14-11 PVA/Ac | 30.0 | CA | | | | | 62.3/6.1/31.6 PVA/Ac/HC | 658 | 267 |
| 21 | 25.0 | 86-89/14-11 PVA/Ac | 10.0 | AcA | 15.0 | Ma | | | 26.0/39.2/34.8 PVA/Ac/HM | 408 | 105 |
| 22 | 100.0 | 43.0/57.0 PVA/Ac | 60.0 | MA | | | | | 23.2/39.6/37.2 PVA/AcHM | 382 | 101 |
| 23 | 25.0 | 86-89/14-11 PVA/Ac | 10.0 | MA | 25.0 | AcA | | | 40.0/44.5/15.5 PVA/Ac/HM | 915 | 136 |
| 24 | 100.0 | 42.3/57.7 PVA/Ac | 30.0 | MA | 30.0 | SA | | | 24.0/43.0/16.0/17.0 PVA/Ac/HM/HS | 437 | 105 |
| 25 | 25.0 | 45.5/54.5 PVA/Ac | 15.0 | IA | | | | | 34.0/37.6/28.4 PVA/Ac/HI | 532 | 123 |
| 26 | 120.0 | 33.2/66.8 PVA/Ac | 80.0 | MA | | | | | 31.5/39.8/28.7 PVA/Ac/HM | 495 | 112 |
| 27 | 50.0 | 53.8/46.2 PVA/Ac | 30.0 | DSA | | | | | 41.1/27.0/31.9 PVA/Ac/HDS | 970 | 192 |
| 28 | 50.0 | 44.3/55.7 PVA/Ac | 25.0 | DSA | | | | | 36.3/45.7/18.0 PVA/Ac/HDS | 1,720 | 153 |
| 29 | 50.0 | 66.2/33.8 PVA/Ac | 35.0 | DSA | 5.0 | MA | | | 38.2/18.2/37.8/5.8 PVA/Ac/HDS/HM | 615 | 186 |
| 30 | 50.0 | 53.8/46.2 PVA/Ac | 30.0 | DSA | | | | | 40.0/29.6/30.4 PVA/Ac/HDS | 1,020 | 185 |
| 31 | 5.0 | 21.5/78.5 PVA/Bu | 5.0 | PA | | | | | 4.0/53.0/43.0 PVA/Bu/HP | 445 | |
| 32 | 20.0 | 21.5/78.5 PVA/Bu | 33.0 | PA | | | | | 1.0/47.0/52.0 PVA/Bu/HP | 371 | |
| 33 | 25.0 | 21.4/78.6 PVA/ClA | 30.0 | PA | | | | | 45.8/54.2 PVClA/HP | 355 | |
| 34 | 50.0 | 98.5-100/1.5-0.0 PVA/Ac | 25.0 | p-Al | 20.0 | PA | | | 63.4/36.6 PVacetal/HP | 525 | |
| 35 | 20.0 | 18.5/81.5 PVA/acetal | 20.0 | PA | | | | | 50.2/49.8 PVacetal/HP | 386 | |
| 36 | 50.0 | 98.5-100/1.5-0.0 PVA/Ac | 75.0 | Formalin | 22.0 | PA | | | 76.2/23.8 PVF/HP | 705 | |
| 37 | 50.0 | 98.5-100/1.5-0.0 PVA/Ac | 40.0 | do | 20.0 | PA | | | 63.2/36.8 PVF/HP | 522 | |
| 38 | 50.0 | 86-89/14-11 PVA/Ac | 61.0 | do | 21.0 | PA | | | 15.0/64.0/21.0 PVAc/F/HP | 910 | |
| 39 | 100.0 | 99-100/1-0 PVA/Ac | 56.0 | do | 100.0 | PA | | | 45.0/55.0 PVF/HP | 350 | |
| 40 | 10.0 | 29.8/70.2 PVA/F | 15.0 | PA | | | | | 35.0/65.0 PVF/HP | 296 | |
| 41 | 50.0 | 12.5/87.5 PVA/F | 40.0 | SA | | | | | 68.2/31.8 PVF/HS | 453 | |
| 42 | 20.0 | 8.7/91.3 PVA/F | 15.0 | SA | | | | | 76.3/23.7 PVF/HS | 607 | |
| 43 | 10.0 | 86-89/14-11 PVA/Ac | 15.2 | PhNCO | 10.0 | PA | | | 6.0/60.0/34.0 PVAc/carb./HP | 570 | |
| 44 | 15.0 | 86-89/14-11 PVA/Ac | 12.0 | PhNCO | 25.0 | PA | | | 8.0/35.0/57.0 PVAc/carb./HP | 336 | |
| 45 | 5.0 | 12.5/87.5 PVA/Cl | 6.0 | PA | | | | | 61.6/38.4 PVCl/HP | 500 | |
| 46 | 5.0 | 15.8/84.2 PVA/F | 6.0 | TMA | | | | | 1.0/51.8/47.2 PVA/F/$H_2$TM | 250 | |
| 47 | 5.0 | 20.3/79.7 PVA/F | 6.0 | TMA | | | | | 1.0/44.2/54.8 PVA/F/$H_2$TM | 215 | |
| 48 | 5.0 | 12.5/19.3/68.2 PVA/Ac/F | 6.0 | TMA | | | | | 12.5/44.0/43.5 PVAc/F/$H_2$TM | 271 | |

*8.0 parts of benzaldehyde also added.

HC=hydrogen carbate, i.e., hydrogen bicyclo[2,2,1]-hept-5-ene-2,3-dicarboxylate
IA=itaconic anhydride
HI=hydrogen itaconate
ClA=chloroacetal
Cl=chloride
P-Al=paraldehyde, i.e., acetaldehyde trimer
F=formal
PhNCO=phenyl isocyanate
Carb.=carbanilate, i.e., phenyl carbamate
TMA=trimellitic anhydride
$H_2TM$=dihydrogen trimellitate
TMGDMA=tetramethylene glycol dimethacrylate
BMAPE=1,2-bis(3-methacrylamidopropoxy)ethane
PEGDMA=polyethylene glycol dimethacrylate wherein the polyethylene glycol is of molecular weight averaging 200
TEGDMA=triethylene glycol dimethacrylate
BMOEOB=1,3-bis($\beta$-methacrylyloxyethoxy)benzene
BTTM=butane-1,2,4-triol tris-methacrylate, i.e., 1,2,4-tris(methacrylyloxy)butane In the same manner as described in Example I, Part B, other acidic polyvinyl alcohol derivative, low molecular weight addition polymerilzable component, photoinitiator compositions were prepared, films cast therefrom, and the films were exposed and developed as outlined in Table II. The solvent media used for casting the films of the photopolymerizable compositions usually was a mixture of methylene chloride and methanol or else ethanol and water. The particular solvent used is not critical since it merely affords a practical method of obtaining films of the compositions. The concentration of the acidic polyvinyl alcohol component in these casting solutions is not critical and may vary from 15 to 30%, based on the solvent alone, i.e., not considering the low molecular weight addition polymerizable component. These ranges gave convenient viscosities for laboratory processing of the film. Higher concentrations can be used, and, as illustrated specifically, with milling or calendering and press equipment no solvent at all is necessary. The thickness of the photopolymerizable layer on the base materials varied from about 10 to 15 to about 40 mils. This thickness is not critical and thicker or thinner films can also be used, depending on the nature of the desired printing relief. Unless otherwise noted in Table II, the compositions contained, as in Example I, Part B, about 1% of benzoin methyl ether as photoinitiator and about 0.01–0.1% hydroquinone stabilizer, both by weight and based on the lower molecular weight polymerizable component.

TABLE II

| No. | Parts | Polymer | Entry Table I | Parts | Percent Whole | Polymerizable | Remarks |
|---|---|---|---|---|---|---|---|
| 1 | 11.0 | 77.0/5.0/18.0 PVAc/acrylal/SOSB | 1 | 3.3 | 23 | PEGDMA | Sharp, scratch-resistant, printable relief image with deep recess areas. Same results with 15, 20, and 25% PEGDMA. |
| 2 | 14.0 | 63.0/18.0/19.0 PVAc/MAB.SOSB | 2 | 4.0 | 22 | PEGDMA | Sharp, scratch-resistant, printable relief image with deep recess areas. Same results with 17.5 and 27% PEGDMA. |
| 3 | 9.7 | 57.0/24.0/6.0/13.0 PVAc/benzal/acrylal/SOSB | 3 | 2.5 | 20 | PEGDMA | Good image but required 50° C. $H_2O$ or 10% methanol to develop. Same results with 15 and 25% PEGDMA. |
| 4 | 10.2 | 50.0/24.0/6.0/20.0 PVAc/benzal/acrylal/SOSB | 4 | 2.5 | 20 | PEGDMA | Sharp, scratch-resistant, printable relief image with deep recess areas. Same results with 15 and 25% PEGDMA. |
| 5 | 12.0 | 10.0/12.0/21.0/57.0 PVA/Ac/acrylal/CPA | 5 | 3.0 | 20 | PEGDMA | Sharp, scratch-resistant, printable relief image with deep recess areas. Used 1% aqueous $NaHCO_3$ to develop. |
| 6 | 4.4 | 36.0/36.0/28.0 PVAc/benzal/CPA | 6 | 1.3 | 20 | PEGDMA | Added 0.7 part (10%) acrylamide. Sharp, scratch-resistant, printable relief image with deep recess areas. Same results with 25% PEGDMA and no acrylamide. |
| 7 | 10.0 | 40.0/36.0/24.0 PVAc/benzal/SOSB | 7 | 3.3 | 25 | PEGDMA | Sharp, scratch-resistant, printable relief image with deep recess areas. Same results with 20% PEGDMA or 25% vinyl benzoate. |
| 8 | 28.2 | 42.0/37.0/21.0 PVAc/benzal/SOSB | 8 | 9.4 | 25 | PEGDMA | Same. Same results with 30% PEGDMA. |
| 9 | 28.0 | 44.0/36.0/20.0 PVAc/benzal/SOSB | 9 | 9.3 | 25 | PEGDMA | Same. Same results with 25% TEGDMA. |
| 10 | 26.1 | 46.0/37.0/17.0 PVAc/benzal/SOSB | 10 | 9.3 | 26 | PEGDMA | Same. Same result with 26% TEGDMA. |
| 11 | 27.0 | 47.0/38.0/15.0 PVAc/benzal/SOSB | 11 | 9.0 | 25 | PEGDMA | Excellent image. Used warm water. Some of deep recess did not wash out. Added 5% methanol to complete development. |
| 12 | 26.0 | 49.0/38.0/13.0 PVAc/benzal/SOSB | 12 | 8.7 | 25 | PEGDMA | Excellent image. Used warm water. Some of deep recess did not wash out. O.K. with 5% methanol. Same results with 25% TEGDMA. |
| 13 | 27.0 | 45.0/37.0/18.0 PVAc/benzal/POSB | 13 | 9.0 | 25 | PEGDMA | Excellent image. All but traces of deep recess areas developed in warm water. Added little methanol to complete development. Same results with 25% TEGDMA. |
| 14 | 19.0 | 39.0/36.0/25.0 PVAc/benzal/POSB | 14 | 6.4 | 25 | TEGDMA | Sharp, scratch-resistant, printable relief image with deep recess areas. Same results with 25% BMOEOB or 25% BTTM. |
| 15 | 42.0 | 45.0/32.0/23.0 PVAc/butyral/SOSB | 15 | 18.0 | 30 | TEGDMA | Sharp, scratch-resistant, printable relief image with deep recess areas. |
| 16 | 18.0 | 47.2/15.8/16.4/20.6 PVA/Ac/HM/HS | 16 | 6.0 | 25 | BMAPE | Hard, scratch-resistant, printable relief of excellent sharpness and with deep recess areas. |
| 17 | 6.0 | 54.3/9.5/36.2 PVA/Ac/HDS | 17 | 2.0 | 25 | BMAPE | Same. |
| 18 | 5.0 | 34.0/12.0/22.0/32.0 PVA/Ac/HM/HS | 18 | 1.7 | 25 | BMAPE | Same. 1% $NaHCO_3$ added in development. |
| 19 | 5.0 | 60.7/18.0/21.3 PVA/Ac/HM | 19 | 1.7 | 25 | BMAPE | Hard, scratch-resistant, printable relief of excellent sharpness and with deep recess areas. Developed in water. |
| 20 | 3.5 | 62.3/6.1/31.6 PVA/Ac/HC | 20 | 1.5 | 30 | BMAPE | Same. |
| 21 | 7.0 | 26.0/39.2/34.8 PVA/Ac/HM | 21 | 3.0 | 30 | TEGDA | Hard, scratch-resistant, printable relief of excellent sharpness and with deep recess areas. |
| 22 | 3.5 | 23.2/39.6/37.2 PVA/Ac/HM | 22 | 1.5 | 30 | TEGDA | Same. |
| 23 | 7.0 | 40.0/44.5/15.5 PVA/Ac/HM | 23 | 3.0 | 30 | BMAPE | Same. |
| 24 | 7.0 | 24.0/43.0/16.0/17.0 PVA/Ac/HM/HS | 24 | 3.0 | 30 | TEGDA | Same. 1% Sodium phosphate added in development. |
| 25 | 3.5 | 34.0/37.6/28.4 PVA/Ac/HI | 25 | 1.5 | 30 | BMAPE | Same. 1% Ethanolamine added in development. |
| 26 | 3.5 | 31.5/39.8/28.7 PVA/Ac/HM | 26 | 1.5 | 30 | TEGDA | Same. 1% Ethanolamine added in development. |
| 27 | 3.5 | 41.1/27.0/31.9 PVA/Ac/HDS | 27 | 1.5 | 30 | TEGDMA | Hard, scratch-resistant, printable relief of excellent sharpness and with deep recess areas. 1% Ammonia added in development. |

| No. | Parts | Polymer | Entry Table I | Parts | Percent Whole | Polymerizable | Remarks |
|---|---|---|---|---|---|---|---|
| 28 | 7.0 | 36.3/45.7/18.0 PVA/Ac/HDS | 28 | 3.0 | 30 | TEGDA | Same. 1% Ammonia added in development. |
| 29 | 21.0 | 38.2/18.2/37.8/5.8 PVA/Ac/HDS/HM | 29 | 14.0 | 40 | TEGDMA | Same. 1% Ammonia added in development. |
| 30 | 24.5 | 40.0/29.6/30.4 PVA/Ac/HDS | 30 | 10.5 | 30 | TEGDMA | Same. 1% Ammonia added in development. |
| 31 | 3.5 | 4.0/53.0/43.0 PVA/Bu/HP | 31 | 1.5 | 30 | TEGDMA | Hard, scratch-resistant, printable relief of excellent sharpness and with deep recess areas. 1% Ethanolamine added in development. |
| 32 | 3.5 | 1.0/47.0/52.0 PVA/Bu/HP | 32 | 1.5 | 30 | TEGDMA | Same. Identical results obtained with 30% EGDMA or TMGDMA. |
| 33 | 22.5 | 45.8/54.2 PVClA/HP | 33 | 9.5 | 30 | TEGDMA | Same. 1% Ethanolamine added in development. |
| 34 | 22.5 | 63.4/36.6 PVAcetal/HP | 34 | 9.5 | 30 | TEGDMA | Hard, scratch-resistant, printable relief of excellent sharpness and with deep recess areas. 1% Ethanolamine added in development. |
| 35 | 22.5 | 50.2/49.8 PVacetal/HP | 35 | 9.5 | 30 | TEGDMA | Same. 1% Ethanolamine added in development. |
| 36 | 20.0 | 76.2/23.8 PVF/HP | 36 | 9.0 | 31 | TEDGMA | Hard, scratch-resistant, printable relief of excellent sharpness and with deep recess areas. 1% Ethanolamine added in development. |
| 37 | 22.5 | 63.2/36.8 PVF/HP | 37 | 9.5 | 30 | TEGDMA | Hard, scratch-resistant, printable relief of excellent sharpness and with deep recess areas. 1% Ethanolamine added in development. |
| 38 | 16.0 | 15.0/64.0/21.0 PVAc/F/HP | 38 | 7.0 | 30 | TEGDMA | Same. |
| 39 | 14.0 | 45.0/55.0 PVF/HP | 39 | 6.0 | 30 | TEGDMA | Same. Composition milled to clear sheet at 120–125° C. and film pressed therefrom at 100° C. 1% Ethanolamine added in development. |
| 40 | 3.5 | 35.0/65.0 PVF/HP | 40 | 1.5 | 30 | TEGDMA | Same. 1% Ethanolamine added in development. |
| 41 | 3.5 | 68.2/31.8 PVF/HS | 41 | 1.5 | 30 | TEGDA | Same. 1% Ethanolamine added in development. |
| 42 | 19.5 | 76.3/23.7 PVF/HS | 42 | 8.4 | 30 | TEGDMA | Same. 1% Ethanolamine added in development. |
| 43 | 7.0 | 6.0/60.0/34.0 PVAc/carb./HP | 43 | 3.0 | 30 | TEGDMA | Hard, scratch-resistant, printable relief of excellent sharpness and with deep recess areas. 1% Ethanolamine added in development. |
| 44 | 7.0 | 8.0/35.0/57.0 PVAc/carb./HP | 44 | 3.0 | 30 | TEGDMA | Same. 1% Ethanolamine added in development. |
| 45 | 0.85 | 61.6/38.4 PVCl/HP | 45 | 0.3 | 26 | TEGDMA | Same. 1% Ethanolamine added in development. |
| 46 | 3.5 | 1.0/51.8/47.2 PVA/F/$H_2$TM | 46 | 1.5 | 30 | TEGDMA | Same. 1% Ethanolamine added in development. |
| 47 | 3.5 | 1.0/44.2/54.8 PVA/F/$H_2$TM | 47 | 1.5 | 30 | TEGDMA | Same. 1% Ethanolamine added in development. |
| 48 | 3.5 | 12.5/44.0/43.5 PVAc/F/$H_2$TM | 48 | 1.5 | 30 | TEGDMA | Same. 1% Ethanolamine added in development. |

EXAMPLE II

A suspension of 7.2 parts of (sodio o-sulfo)-benzaldehyde dihydrate in about 25 parts of 95% ethanol and about 140 parts of acetone was warmed to 60° C. to dissolve the sulfoaldehyde. The solution was then cooled to 20° C. and about 3 parts of 18 N sulfuric acid was added and the resultant precipitate of $Na_2SO_4$ removed by filtration. To the clear filtrate was added 45 parts of the polyvinyl alcohol/acetate used in Example I and the resulting suspension stirred at 50° C. for 45 minutes. The slurry was cooled to 25° C. and about 15 parts of a 10% solution of sodium methylate in methanol was added and the resultant mixture diluted with about 60 parts of acetone and then filtered. The filter cake was washed with acetone, slurried in acetone for several minutes, and again filtered and washed with acetone. The slurrying and washing steps were repeated and the resultant white solid product was dried. There was thus obtained 52 parts of a 65/19/16 polyvinyl alcohol/acetate/(sodio o-sulfo)benzal as a white solid product exhibiting a neutral equivalent of 1690.

Films were cast from a solution of three parts of the above polyvinyl alcohol/acetate/benzol, two parts of 1,3-bis(methacrylamido)-2-propanol, and 0.05 part of benzoin methyl ether in a mixture of about 4 parts of methyl alcohol and 5 parts of water. Evaporation of the mixed solvents in subdued light, exposure to a line process transparency, and development in water, all as described in detail in Example I, part B, resulted in the formation of a printing relief with excellent sharpness and deep recess areas.

The 1,3-bis(methacrylamido)-2-propanol was prepared by the acylation of 1,3-diamino-2-propanol with methacrylyl chloride in the presence of aqueous potassium carbonate at 0–5° C. and obtained as colorless crystals melting at 75–77° C. after recrystallization from methylene chloride/diethyl ether mixture.

*Analysis.*—Calc'd for $C_{11}H_{18}O_2$: C, 58.4%; H, 8.0%; N, 12.4%. Found: C, 58.8%; H, 8.1%; N, 12.4%, 12.5%.

EXAMPLE III

Films were cast from a solution of 6.5 parts of a commercially available polyvinyl hydrogen phthalate (N.E.=192), 3.5 parts (35% of the solids) of triethylene glycol dimethacrylate, and 0.1 part of benzoin methyl ether in a 50/50 mixture of acetone and methanol. Evaporation of the mixed solids in subdued light, exposure to a line process transparency, and development using dilute aqueous sodium bicarbonate solution, all in the manner described in Example I, part B, resulted in the formation of a printing relief of excellent sharpness with deep recess areas.

EXAMPLE IV

A suspension of 50 parts of the polyvinyl alcohol/acetate used in Example I, 25 parts of maleic anhydride, and 0.05 part of hydroquinone in about 125 parts of dioxane was stirred at 83—85° C. for one hour. The reaction mixture was then diluted with about 150 parts of acetone and the resultant solid removed by filtration and washed with acetone. The solid was then taken up and acetone slurried for several minutes, filtered, washed again with acetone, and finally dried to constant weight under reduced pressure at 40–50° C. There was thus obtained 67 parts of a 51.2/17.1/31.7 polyvinyl alcohol/acetate/hydrogen maleate as a white powdery solid, exhibiting a neutral equivalent of 448 and a saponification number of 155.

Films were cast from a solution of 5 parts of the above polyvinyl alcohol/acetate/hydrogen maleate, 2.1 parts (38% of total solids) of 1,2-bis(3-methacrylamidopropoxy)ethane, and 0.07 part of benzoin methyl ether in a mixture of about ten parts of ethyl alcohol and eight parts of water. Evaporation of the solvents under subdued light, exposure through a line process transparency, and development in warm water all as described in Example I, Part B, resulted in the formation of a printing relief with excellent sharpness and deep recess areas. Similar results were obtained with films containing 20, 25, 30, 35, and 40% by weight of the polymerizable component.

The 1,2-bis(3-methacrylamidopropoxy)ethane was prepared by the acylation of bis(1,3-diaminopropoxy) ethane with methacrylyl chloride at 0°–5° C. in the presence of aqueous potassium carbonate and obtained as colorless crystals melting at 74–75° C. after recrystallization from methylene chloride/diethyl ether mixture.

*Analysis.*—Calc'd for $C_{16}H_{28}O_4N_2$: C, 61.5%; H, 9.0%; N, 9.0%. Found: C, 61.5%; H, 9.0%; N, 8.9%, 9.0%.

EXAMPLE V

A mixture of 6 parts of a 47.3/52.7 polyvinyl formal/hydrogen phthalate (similar to the polymer of entry 39 of Table I), 4 parts of triethylene glycol diacrylate, 0.1 part of benzoin methyl ether, and 0.01 part of hydroquinone in about 15 parts of diethyl ether was mixed thoroughly and allowed to stand at room temperature in a closed vessel for about 3 hours with occasional stirring. The ether was removed by evaporation under reduced pressure at 30–40° C. and the resulting material milled on a rubber mill at a temperature of 100° C. for about one minute, whereupon a clear homogeneous film was obtained. Six parts of a commercially available finely divided silica filler was mixed into the composition on the rubber mill at about 100° C. The mixture was sheeted off, allowed to cool to room temperature, and mounted on an aluminum plate 20 mils thick, on the upper surface of which had been placed a film of a yellow thermoplastic resin. The laminate was pressed at 100° C. for about one minute, using spacers at the four corners so that the photopolymerizable layer, i.e., the polyvinyl formal/hydrogen phthalate, bis-methacrylate, silica, initiator, stabilizer composition was about 40 mils thick. The assembly was cooled to room temperature in the press under pressure as rapidly as possible. Exposure through a line process transparency and development as described in Example I, Part A, using 1% aqueous ethanolamine as the developing medium resulted in the formation of a printing relief exhibiting excellent sharpness and having deep recess areas.

Substantially identical results were obtained from a photopolymerizable composition comprising 5 parts of a 54.7/45.3 polyvinyl formal/hydrogen phthalate, 5 parts of triethylene glycol diacrylate, 0.1 part of benzoin methyl ether, 0.01 part of hydroquinone, and 3 parts of finely divided silica. Substantially identical results were also obtained from another composition comprising 5 parts of a commercially available polyvinyl hydrogen phthalate, 5 parts of triethylene glycol diacrylate, 0.1 part of benzoin methyl ether, 0.06 part of hydroquinone and 5 parts of the same silica filler, varying only in that the initial compounding of the composition on the rubber mill was carried out at 75–80° C. for about 10 minutes.

EXAMPLE VI

*Part A.—Preparation of a polyvinyl acetate/acrylal/(sodio o-sulfo)benzal*

Example I, Part A, was substantially repeated, using 185 parts of glacial acetic acid, 7.5 parts of trifluoroacetic acid, 0.15 part of hydroquinone, 19 parts of freshly distilled benzaldehyde, 14.7 parts of (sodio o-sulfo) benzaldehyde dihydrate, 45 parts of the same polyvinyl alcohol, and 75 parts of acetic anhydride. The mixed ester/acetal was isolated and purified essentially as described before. There was thus obtained 326 parts of a solution (25.6% solids) of 43./37.2/19.5 polyvinyl acetate/benzal/(sodio o-sulfo)benzal exhibiting a neutral equivalent of 1430.

*Part B.—Preparation of a polyvinyl acetate/benzal/(sodio o-sulfo)benzal based printing relief*

Example I, Part B was repeated, using 65 parts of the above solution containing 16.5 parts of the solid polyvinyl acetate/benzal/(sodio o-sulfo)benzal, 5.5 parts (25% by weight) of n-butyl methacrylate, and 0.22 part of benzoin methyl ether. There were thus obtained scratch-resistant printing reliefs exhibiting good sharpness and deep recess areas. Equally good printing relief images were obtained in duplicate examples substituting: (*a*) 12.5% of triethylene glycol bis-methacrylate and 12.5% of n-butyl methacrylate, (*b*) 33.3% of triethylene glycol dimethacrylate and 8.7% of tricresylphosphate, and (*c*) 25% of vinyl benzoate, respectively, for the 25% n-butyl methacrylate.

EXAMPLE VII

To a solution of 3.5 parts of a 32.8/31.9/35.3 polyvinyl alcohol/acetate/hydrogen dodecenylsuccinate in a mixture of about eight parts of ethanol and 4 parts of water was added 1.5 parts (30% by weight of the whole) of triethylene glycol dimethacrylate, 0.05 part of benzoin methyl ether, and about 1.6 parts of 1 N $NaHCO_3$ solution—the latter serving to neutralize 40% of the carboxyl groups, i.e., to form a polyvinyl alcohol/acetate/hydrogen dodecenylsuccinate/sodio dodecenylsuccinate based composition. The resulting solution was cast on a glass plate and the solvents allowed to evaporate at room temperature in subdued light. The resulting transparent film was exposed under a process transparency as above and developed with water. There was thus obtained a printing relief with scratch-resistant images of the text of the negative exhibiting excellent sharpness and with deep recess areas. Similar printing reliefs were obtained with like compositions in which 5, 10, 15, 20, and 50% of the carboxyl groups had been neutralized. When only 5% of the carboxyl groups were neutralized removal of the unexposed material was slow in water but rapid in aqueous 1% ethanolamine. Similar images were obtained from like compositions in which 50% of the carboxyl groups were neutralized with potassium or lithium carbonate.

The compositions of the present invention (i.e., the acidic polyvinyl alcohol component or salt thereof, the polymerizable low molecular weight component, and the photoinitiator) must exhibit an optical density less than 0.5 per mil. This requirement is important in the formation of printing reliefs wherein layer thicknesses will lie between 3 and 250 mils. In such film form, the compositions must exhibit an optical density less than 5.0 to the utilized actinic light. The following Table III presents optical density data for certain of the foregoing compositions. The first three entries being those of Examples II, III and IV, and the remaining entries being those of the indicated numbered compositions of Table II. The first nine entries were obtained on solutions of the indicated compositions in the indicated solvents at concentrations to give the indicated density values per mil of thickness in film form. The data given for the last six entries were obtained on films of the indicated compositions at the indicated thicknesses. The optical density values given in the last five columns for light of the indicated wavelength from 3500 A. and up are reported in units of $10^{-2}$ since the density becomes so low with increasing wavelength.

OPTICAL DENSITIES OF VARIOUS COMPOSITIONS

| Table II Item | Solvent | Film Mils Thick | Optical Density Per Mil | | | | | | |
|---|---|---|---|---|---|---|---|---|---|
| | | | 3,000 A. | 3,100 A. | ×10⁻² | | | | |
| | | | | | 3,500 A. | 4,000 A. | 5,000 A. | 6,000 A. | 7,000 A. |
| Ex. II | EW | | 0.18 | 0.12 | 4.5 | 0.73 | 0.27 | 0.14 | 0.14 |
| Ex. III | MM | | 0.31 | 0.10 | 4.0 | 0.50 | 0.15 | 0.10 | 0.05 |
| Ex. IV | EW | | 0.18 | 0.10 | 3.8 | 0.48 | 0.24 | 0.19 | 0.19 |
| 16 | EW | | 0.19 | 0.11 | 5.1 | 0.97 | 0.57 | 0.45 | 0.40 |
| 19 | EW | | 0.18 | 0.10 | 4.1 | 0.51 | 0.17 | 0.11 | 0.11 |
| 20 | EW | | 0.16 | 0.12 | 5.3 | 0.91 | 0.48 | 0.43 | 0.37 |
| 46 | MM | | | 0.27 | 4.8 | 0.96 | 0.43 | 0.21 | 0.16 |
| 47 | MM | | | 0.32 | 5.3 | 1.12 | 0.53 | 0.32 | 0.21 |
| 48 | MM | | | 0.37 | 5.9 | 1.28 | 0.38 | 0.16 | 0.16 |
| 24 | | 43.5 | | | 3.6 | 0.53 | 0.28 | 0.23 | 0.21 |
| 22 | | 43.5 | | 0.06 | 3.3 | 0.46 | 0.28 | 0.23 | 0.23 |
| 28 | | 40.0 | | 0.06 | 3.7 | 0.73 | 0.30 | 0.25 | 0.25 |
| 30 | | 35.2 | | | 3.7 | 0.68 | 0.34 | 0.29 | 0.29 |
| 27 | | 34.2 | | | 3.7 | 0.64 | 0.32 | 0.29 | 0.26 |
| 29 | | 43.0 | | | 2.5 | 0.88 | 0.54 | 0.42 | 0.35 |

EW=50/50 ethanol/water by volume.
MM=50/50 methanol/methylene chloride by volume.

As stated previously, the photopolymerizable compositions of this invention, after exposure and development, form printing plates exhibiting excellent wear-resistance, comparable to copper-faced electrotypes. More specifically, samples as given in Table II, using, respectively, (*a*) a 27.0/41.1/31.9 polyvinyl acetate/alcohol/hydrogen dodecenylsuccinate, (*b*) a 76.3/23.7 polyvinyl formal/hydrogen succinate, and (*c*) a 47.2/15.8/16.4/20.6 polyvinyl alcohol/acetate/hydrogen maleate/hydrogen succinate with 30% of triethylene glycol dimethacrylate in the case of the first two and 25% of bis-methacrylamidopropoxyethane for the last one, using benzoin methyl ether initiator and hydroquinone stabilizer resulted in plates which gave the following wear data in an accelerated wear test.

| Item | Plate Wear in Mils | |
|---|---|---|
| | Sample | Copper Electrotype Control |
| (*a*) | 3.6±1.5 | 1.9±0.7 |
| (*b*) | {1.8±0.3<br>0.8±0.5 | 1.6±0.5<br>1.7±0.5 |
| (*c*) | 3.1±0.6 | 2.2±0.2 |

In this test a printing plate made from the compositions under test and developed in aqueous base, the said plate being 65–75 mils in total thickness (including a 15-mil thick metal base plate, a 1- to 2-mil thick antihalation anchor layer, and a 48- to 58-mil thick film of the photopolymerized composition) and carrying quarter-inch square block reliefs 48 to 58 mils high, is mounted on a rotary press. Using abrasive ink and abrasive paper, 5000 impressions are made. The press is purposely misadjusted so that the impression pressure is four times normal and a scuffing action is achieved between the plate and the paper by adjusting the plate and impression cylinders to revolve at different peripheral speeds. As a result of these factors, the wear on the trailing edge of both the control and test plates is approximately 100 times greater than under normal printing conditions. Thus, the standard 5000 impressions used for the tests, requiring about 1.3 hours, approximates a 500,000 impression run which would require about 200 hours in normal work. Wear measurements were taken directly with a toolmaker's microscope. The control values are given for a copper-faced electrotype which is always run as a control with each test plate.

In addition to the foregoing acidic substituted polymers and salts thereof, the following acidic polyvinyl alcohol polymers are useful in forming the new compositions of this invention [They can also be used in the soluble salt form.]:

(1) Polyvinyl hydrogen carboxylates from aliphatic dicarboxylic acids, e.g., polyvinyl hydrogen oxalate, N.E.=116; polyvinyl hydrogen malonate, N.E.=130; polyvinyl hydrogen glutarate, N.E.=158; polyvinyl hydrogen adipate, N.E.=198; polyvinyl hydrogen suberate, N.E.=226; polyvinyl hydrogen maleate, N.E.=142; polyvinyl undecenylsuccinate, N.E.=310; polyvinyl hydrogen allylsuccinate, N.E.=184;

(2) Polyvinyl hydrogen carboxylates from aromatic dicarboxylic acids, e.g., polyvinyl hydrogen isophthalate, N.E.=192; polyvinyl hydrogen terephthalate, N.E.=192; polyvinyl 2-naphthoate-6-carboxylic acid, N.E.=242; polyvinyl hydrogen 2,5-dichloroterephthalate, N.E.=261; polyvinyl hydrogen tetrachlorophthalate, N.E.=330;

(3) Polyvinyl hydrogen carboxylates from cycloaliphatic dicarboxylic acids, e.g., polyvinyl hydrogen hexahydrophthalate, N.E.=198; polyvinyl hydrogen hexahydroterephthalate, N.E.=198; polyvinyl decahydro-2-naphthoate-7-carboxylic acid, N.E.=248; polyvinyl hydrogen carbate, N.E.=208; polyvinyl hydrogen chlorendate, N.E.=415; polyvinyl 2-carboxylic-1-cyclobutanecarboxylate, N.E.=170; polyvinyl 2-carboxylic-3-methyl-1-cyclobutene-1-carboxylate, N.E.=182;

(4) Polyvinyl hydrogen carboxylates from aralkyldicarboxylic acids, e.g., polyvinyl o-carboxymethylphenylacetate, N.E.=220; polyvinyl p-carboxymethylphenylacetate, N.E.=220; polyvinyl o-carboxyphenylacetate, N.E.=206;

(5) Polyvinyl hydrogen carboxylates from mixtures of aliphatic and aromatic dicarboxylic acids, e.g., polyvinyl hydrogen succinate/hydrogen phthalate (90/10), N.E.=147; polyvinyl hydrogen oxalate/hydrogen isophthalate (50/50), N.E.=145; polyvinyl hydrogen maleate/hydrogen adipate (10/90), N.E.=166; polyvinyl hydrogen chloromaleate/hydrogen terephthalate (25/75), N.E.=188;

(6) Polyvinyl hydrogen carboxylates having a heteroatom in the acid side chain, e.g., polyvinyl hydrogen diglycollate, N.E.=160; polyvinyl hydrogen thiodiglycollate, N.E.=176; polyvinyl p-carboxyphenoxybenzoate, N.E.=294; polyvinyl hydrogen o-carboxyphenoxyacetae, N.E.=222;

(7) Polyvinyl ester/acidic esters, e.g., (*a*) polyvinyl acetate/hydrogen succinate (13/87), N.E.=166; (*b*) polyvinyl acetate/methacrylate/hydrogen succinate (16/8/76), N.E.=208; (*c*) polyvinyl benzoate/acrylate/hydrogen succinate (41/4/55), N.E.=262; (*d*) polyvinyl p-chlorobenzoate/hydrogen fumarate (12.5/87.5), N.E.=158; polyvinyl formate/hydrogen terephthalate (65/35), N.E.=550; polyvinyl proprionate/hydrogen phthalate (40/60), N.E.=320; polyvinyl methacrylate/butyrate/2-naphthoate-6-carboxylic acid (5/40/55), N.E.=440;

(8) Polyvinyl alcohol/acidic esters, e.g., (*a*) polyvinyl alcohol/hydrogen phthalate (10/90), N.E.=213; (*b*) polyvinyl alcohol/hydrogen succinate (19/81), N.E.=178; (*c*) polyvinyl alcohol/hydrogen glutarate (29/71), N.E.=222; (*d*) polyvinyl alcohol/hydrogen maleate (65/35), N.E.=395;

(9) Polyvinyl alcohol/ester/acidic esters, e.g., (*a*) polyvinyl alcohol/acetate/hydrogen isophthalate (10/60/30), N.E.=640; (*b*) polyvinyl alcohol/proprionate/hydrogen maleate (15/45/40), N.E.=355; (*c*) polyvinyl alcohol/benzoate/hydrogen terephthalate (5/55/40), N.E.=480; (*d*) polyvinyl alcohol/crotonate/hydrogen succinate (15/40/45), N.E.=320; (*e*) polyvinyl alcohol/acetate/sorbate/hydrogen glutarate (5/45/10/40), N.E.=390; (*f*) polyvinyl alcohol/methacrylate/acetate/hydrogen succinate (3/7/45/45), N.E.=320; (*g*) polyvinyl alcohol/acetate/hydrogen maleate (30/10/60), N.E.=236; (*h*) polyvinyl alcohol/acetate/hydrogen succinate (16/13/71), N.E.=204; (*i*) polyvinyl alcohol/acetate/hydrogen maleate (29/34/37), N.E.=384.

(10) Polyvinyl halide/ester/acidic esters, e.g., polyvinyl chloride/acetate/hydrogen succinate (25/25/50), N.E.=284; polyvinyl fluoride/acetate/hydrogen glutarate (30/10/60), N.E.=260; polyvinyl bromide/acetate/hydrogen phthalate (40/10/50), N.E.=384; polyvinyl chloride/acetate/methacrylate/hydrogen succinate (20/15/5/60), N.E.=240; polyvinyl fluoride/benzoate/hydrogen succinate (25/25/50), N.E.=288; polyvinyl chloride/butyrate/hydrogen maleate (30/30/40), N.E.=373;

(11) Polyvinyl alcohol/halide/ester/acidic esters, e.g., (*a*) polyvinyl alcohol/chloride/acetate/hydrogen phthalate (5/10/15/70), N.E.=275; (*b*) polyvinyl alcohol/fluoride/benzoate/crotonate/hydrogen succinate (8/5/9/7/71), N.E.=203; (*c*) polyvinyl alcohol/chloride/chloroacetate/hydrogen maleate (2/23/25/50), N.E.=284; polyvinyl alcohol/bromide/acetate/acrylate/hydrogen carbate (16/10/30/4/50), N.E.=416;

(12) Acidic esters of alkene/vinyl ester copolymers, i.e., alkene/vinyl ester/acidic ester copolymers, e.g., copolymers of (*a*) ethylene/vinyl acetate/vinyl hydrogen succinate (4/42/54), N.E.=266; ethylene/vinyl benzoate/vinyl hydrogen succinate (5/40/55), N.E.=262; propylene/vinyl acetate/vinyl hydrogen maleate (4/46/50), N.E.=284; ethylene/vinyl acetate/vinyl hydrogen glutarate (15/40/45), N.E.=347;

(13) Acidic esters of alkene/polyvinyl alcohol/ester terpolymers, i.e., alkene/vinyl alcohol/ester/acidic ester copolymers, e.g., copolymers of (*a*) ethylene/vinyl alcohol/vinyl acetate/vinyl hydrogen succinate (5/5/40/50), N.E.=288; (*b*) ethylene/vinyl alcohol/vinyl acetate/vinyl hydrogen phthalate (2/22/9/67), N.E.=286;

(14) Acidic aliphatic polyvinyl acetal/esters, e.g., polyvinyl formal/hydrogen glutarate (50/50), N.E.=312; polyvinyl acetal/hydrogen carbate (40/60), N.E.=347; polyvinyl butyral/hydrogen allylsuccinate (60/40), N.E.=460; polyvinyl propional/hydrogen maleate (65/35), N.E.=405; polyvinyl chloroacetal/hydrogen glutarate (70/30), N.E.=520; polyvinyl formal/acrylal/hydrogen succinate (50/10/40), N.E.=360; polyvinyl butyral/hydrogen adipate (50/50), N.E.=396;

(15) Acidic aromatic polyvinyl acetal/esters, e.g., polyvinyl benzal/hydrogen phthalate (50/50), N.E.=384; polyvinyl p-vinyl benzal/hydrogen terephthalate (40/60), N.E.=320; polyvinyl benzoate/p-carboxybenzal (40/60), N.E.=367; polyvinyl fural/hydrogen phthalate (40/60), N.E.=320;

(16) Polyvinyl acetal/ester/acidic esters, e.g., polyvinyl formal/acetal/hydrogen terephthalate (40/30/30),

N.E.=640 polyvinyl formal/butyrate/carbonate/hydrogen succinate (40/10/10/40), N.E.=360; polyvinyl benzal/propionate/hydrogen maleate (35/25/40), N.E.=355; polyvinyl acrylal/acetal/acetate/p-carboxyphenoxyacetate (5/15/30/50), N.E.=480; polyvinyl formal/acetate/sorbate/hydrogen glutarate (30/10/5/55), N.E.=284; polyvinyl β-chloropropional/benzoate/hydrogen oxalate (30/30/40), N.E.=290;

(17) Polyvinyl acetal/alkyl ether/acidic esters, e.g., polyvinyl formal/methyl ether/hydrogen phthalate (40/10/50), N.E.=384; polyvinyl acetate/ethyl ether/hydrogen succinate (60/10/30), N.E.=480; polyvinyl benzal/methyl ether/hydrogen diglycollate (45/30/25),

N.E.=640 polyvinyl butyral/hydroxyethyl ether/hydrogen glutarate (60/10/30), N.E.=520; polyvinyl alcohol/formal/β-cyanoethyl ether/hydrogen phthalate (5/20/25/50)

N.E.=385

(18) Polyvinyl hydrogen sulfonates and ester/hydrogen sulfonates, e.g., polyvinyl o-sulfobenzoate, N.E.=228; polyvinyl β-sulfopropionate, N.E.=180; polyvinyl δ-sulfovalerate, N.E.=208; polyvinyl p-sulfophenylacetate, N.E.=242; polyvinyl acetate/o-sulfobenzoate (50/50), N.E.=456; polyvinyl benzoate/γ-sulfopropionate (50/50), N.E.=296; polyvinyl acetate/crotonate/2-sulfo-4-carboxybenzoate (40/30/30), N.E.=453;

(19) Polyvinyl acetal/hydrogen sulfonates and acetal/ester/hydrogen sulfonates, e.g., polyvinyl formal/acetate/o-sulfobenzal (60/20/20), N.E.=1280; polyvinyl formal/butyral/p-sulfobenzoate (10/60/30), N.E.=760; polyvinyl alcohol/acetate/formal/o-sulfobenzal (5/40/30/25), N.E.=1020; polyvinyl alcoholacetate/butyral/m-sulfobenzal (15/20/45/20), N.E.=1280;

(20) Polyvinyl acetal/ester/acidic esters with a plurality of the latter, e.g., polyvinyl formal/hydrogen phthalate/hydrogen succinate (70/10/20), N.E.=524; polyvinyl acetal/hydrogen maleate/hydrogen succinate (65/10/25), N.E.=412; polyvinyl alcohol/benzal/hydrogen terephthalate/hydrogen glutarate (8/52/10/30),

N.E.=408 polyvinyl formal/crotonate/o-sulfobenzoate/hydrogen succinate (40/10/10/40), N.E.=310; polyvinyl alcohol/formal/hydrogen phthalate/hydrogen succinate/hydrogen maleate (10/50/15/15/10), N.E.=398; polyvinyl butyral/β-sulfopropionate/hydrogen succinate (70/20/10), N.E.=558; polyvinyl alcohol/acetate/formal/acrylal/hydrogen succinate/hydrogen phthalate (5/15/35/5/20/20), N.E.=428;

(21) Polyvinyl acidic acetal/ester/acidic esters, e.g., polyvinyl acetate/o-sulfobenzal/hydrogen succinate (70/20/10), N.E.=678; polyvinyl benzoate/p-carboxybenzal/hydrogen phthalate (75/15/10), N.E.=833; polyvinyl acetate/butyral/carboxyformal/hydrogen glutarate (10/35/35/20), N.E.=508; polyvinyl acetate/sorbate/formal/β-sulfopropional/hydrogen adipate (25/5/40/10/20),

N.E.=575 polyvinyl acetate/acetal/m-sulfobenzal/o-sulfobenzoate (15/60/10/15), N.E.=970;

(22) Polyvinyl alcohol/acetal/ester/acidic esters, e.g., (*a*) polyvinyl alcohol/acetate/formal/hydrogen diglycollate (18/14/10/58), N.E.=277; (*b*) polyvinyl alcohol/acetate/acetal/hydrogen maleate (30/11/13/46),

N.E.=309

(*c*) polyvinyl alcohol/acetate/formal/hydrogen succinate (13/4/5/78), N.E.=185; (*d*) polyvinyl alcohol/acetate/butyral/hydrogen phthalate (7/17/23/53), N.E.=363; (*e*) polyvinyl alcohol/acetate/formal/hydrogen carbate (3/5/6/86), N.E.=239; polyvinyl alcohol/acetate/hydrogen adipate (52.0/2.5/45.5), N.E.=378;

(23) Polyvinyl acetal/sulfoacetals/sulfoesters, and/sulfate esters, e.g., polyvinyl formal/o-sulfobenzal (80/20), N.E.=1280; polyvinyl butyral/β-sulfopropional (75/25), N.E.=720; polyvinyl alcohol/acetal/γ-sulfovalerate (15/70/15), N.E.=1390; polyvinyl alcohol/formal/hydrogen sulfate (10/80/10), N.E.=1240;

(24) Polyvinyl acetal/ester/sulfonic acids and acetals, e.g. (*a*) polyvinyl alcohol/acetate/formal/o-sulfobenzal (4/41/14/41), N.E.=625; (*b*) polyvinyl alcohol/acetate/m-sulfobenzal (64/14/22), N.E.=1160; (*c*) polyvinyl alcohol/formal/o-sulfobenzoate (20/55/25), N.E.=910; (*d*) polyvinyl alcohol/acetate/formal/β-sulfopropionate (11/42/14/33), N.E.=545; (*e*) polyvinyl alcohol/butyral/γ-sulfobutyrate (19/53/28), N.E.=1290;

(25) Polyvinyl acetal/ester/carbamate/acidic esters, e.g., polyvinyl acetate/formal/N-phenylcarbamate/hydrogen phthalate (10/50/10/30), N.E.=640; polyvinyl benzoate/acetal/N-p-chlorophenylcarbamate/hydrogen succinate (20/40/10/30), N.E.=480; polyvinyl acetate/formal/acetal/N - phenylcarbamate/hydrogen isophthalate (10/20/20/20/30), N.E.=640; (*d*) polyvinyl alcohol/N-phenylcarbamate/hydrogen succinate (12/7/81),

N.E.=222 polyvinyl alcohol/acetate/acetal/N - ethylcarbamate/hydrogen phthalate (17/15/33/10/25), N.E=770; polyvinyl alcohol/butyral/N - p-carbomethoxyphenylcarbamate/hydrogen succinate/hydrogen phthalate (5/30/25/10/30), N.E.=442; polyvinyl acetate/formal/N - carbethoxymethylcarbamate/hydrogen phthalate (20/30/10/40),

N.E.=480

(26) Polyvinyl ester/carbamate/acidic esters, e.g., (*a*) polyvinyl acetate/N-phenylcarbamate/hydrogen hexahydrophthalate (30/15/55), N.E.=360; (*b*) polyvinyl benzoate/N - methylcarbamate/hydrogen maleate (30/15/55), N.E.=258; polyvinyl acetate/N-phenylcarbamate/hydrogen Δ-4,5-tetrahydrophthalate (20/15/65),

N.E.=302 polyvinyl acetate/N, N-diethylthiocarbamate/hydrogen succinate (20/25/55), N.E.=258;

(27) Polyvinyl alcohol/ester/carbamate/acidic esters, e.g. (*a*) polyvinyl alcohol/acetate/N-phenylcarbamate/hydrogen succinate (40/1/4/55), N.E.=257; (*b*) polyvinyl alcohol/acetate/N-carbethoxymethylcarbamate/hydrogen phthalate (20.1/1.0/1.5/77.4), N.E.=249; (*c*) polyvinyl alcohol/acetate/N - p-chlorophenylcarbamate/hydrogen glutarate (9.8/1.4/1.6/87.2), N.E.=229; (*d*) polyvinyl alcohol/N-α-naphthylcarbamate/hydrogen α-methylsuccinate (5/3/92), N.E.=170;

(28) Acidic esters of vinyl ester/vinyl amide copolymers, e.g., poly-N-vinyl-N-alkylamide/vinyl ester/vinyl acidic esters, e.g., poly-N-vinyl-N-methylformamide/vinyl acetate/vinyl hydrogen succinate (30/30/40), N.E.=360; poly-N-vinyl-N-methylformamide/vinyl acetate/vinyl hydrogen phthalate (15/40/45), N. E.=426; poly-N-vinyl-N-methylformamide/vinyl acetate/vinyl hydrogen glutarate (40/15/45), N.E.=348; poly-N-vinyl-N-methylacetamide/vinyl acetate/vinyl hydrogen succinate/vinyl hydrogen maleate (30/30/30/10), N.E.=350; poly-N-vinylphthalamide/vinyl methacrylate/vinyl acetate/vinyl hydrogen succinate (5/25/30/40), N.E.=360; poly-N-vinylcaprolactam/vinyl acetate/vinyl hydrogen phthalate (20/30/50), N.E.=384;

(29) Acidic esters of vinyl amide/ester/acetal copolymers, e.g., poly-N-vinyl-N-alkylamide/vinyl ester/vinyl acetal/vinyl acidic esters, e.g., poly-N-vinyl-N-methylformamide/vinyl formal/vinyl acetal/vinyl hydrogen succinate (20/30/20/30), N.E.=460; poly-N-vinyl-N-methylacetamide/vinyl methacrylate/vinyl acetate/vinyl acetal/vinyl hydrogen phthalate (10/10/20/20/40), N.E.=480; poly-N-vinyl-N-methylbenzamide/vinyl acetate/vinyl formal/vinyl hydrogen succinate/vinyl hydrogen maleate (10/25/15/40/10), N.E.=288; poly-N-vinylpyrrolidone/vinyl acetate/vinyl formal/vinyl hydrogen succinate (10/20/30/40), N.E.=360;

(30) Acidic esters of vinyl amide/alcohol/ester/copolymers, e.g., poly-N-vinyl-N-alkylamide/vinyl alcohol/vinyl ester/vinyl acidic esters, e.g., poly-N-vinyl-N-methylformamide/vinyl alcohol/vinyl acetate/vinyl hydrogen succinate (11/64/12/13), N.E.=1100; poly-N-vinyl-N-caprolactam/vinyl alcohol/vinyl benzoate/vinyl hydrogen maleate (19/50/18/13) N.E.=1090; poly-N-vinylpyrrolidone/vinyl alcohol/vinyl acetate/o-sulfobenzoate (20/55/13/12), N.E.=1140;

(31) Acidic esters of vinyl amide/alcohol/ester/acetal copolymers, e.g., poly-N-vinyl-N-alkyl amide/vinyl alcohol/vinyl ester/vinyl acetal/vinyl acidic esters, e.g., poly - N - vinyl - N - methylformamide/vinyl alcohol/vinyl acetate/vinyl hydrogen succinate (20/5/35/40), N.E.=360; poly-N-vinyl-N-methylformamide/vinyl alcohol/vinyl acetate/hydrogen phthalate (10/25/15/50), N.E.=384;

(32) Sulfonic esters of vinyl amide/alcohol and/or ester copolymers, e.g., poly-N-vinyl-N-alkyl amide/vinyl alcohol and/or ester/vinyl acidic esters, e.g., poly-N-vinyl-N-methylformamide/vinyl acetate/vinyl o-sulfobenzoate (30/30/40), N.E.=570; poly-N-vinyl-N-methylacetamide/vinyl/acetate/vinyl β-sulfopropionate (40/30/30), N.E.=600; poly-N-vinyl-N-methylformamide/vinyl alcohol/vinyl acetate/vinyl o-sulfobenzoate (10/20/40/30), N.E.=760;

(33) Polyvinyl alcohol/acetal/acidic esters, e.g., (*a*) polyvinyl alcohol/formal/hydrogen succinate (7/13/80), N.E.=181; (*b*) polyvinyl alcohol/formal/hydrogen carbate (8/22/70), N.E.=298; (*c*) polyvinyl alcohol/formal/hydrogen phthalate (30/20/50), N.E.=250; (*d*) polyvinyl alcohol/butyral/hydrogen phthalate (3/8/89), N.E.=216; (*e*) polyvinyl alcohol/acetal/hydrogen hexahydrophthalate (17/10/73), N.E.=264; (*f*) polyvinyl alcohol/formal/hydrogen diglycollate (2/45/53), N.E.=400;

(34) Polyvinyl alcohol/ester/sulfoacetals and/sulfoesters, e.g., (*a*) polyvinyl alcohol/acetate/o-sulfobenzal (31/25/44), N.E.=582; (*b*) polyvinyl alcohol/acetate/m-sulfobenzal (2/74/24), N.E.=1070; (*c*) polyvinyl alcohol/acetate/p-sulfobenzal (13/55/32), N.E.=800; (*d*) polyvinyl alcohol/acetate/o-sulfobenzoate (5.7/76.8/17.5), N.E.=1300;

(35) Polyvinyl alcohol/acetal/sulfoesters, e.g., (*a*) polyvinyl alcohol/formal/β-sulfopropionate (15.6/72.1/12.3), N.E.=1460; (*b*) polyvinyl alcohol/formal/o-sulfobenzoate (8.8/68.8/22.4), N.E.=1020; (*c*) polyvinyl alcohol/butyral/o-sulfobenzoate (4.5/57.3/38.2), N.E.=597;

(36) Polyvinyl alcohol/carboxylate/sulfonate/sulfocarboxylates, e.g., (*a*) polyvinyl alcohol/acetate/p-toluenesulfonate/hydrogen carbate (1.2/4.6/5.3/88.9), N.E.=260; (*b*) polyvinyl alcohol/acetate/methanesulfonate/β-sulfopropionate (35.4/38.0/9.6/17.0), N.E.=1050; (*c*) polyvinyl alcohol/benzenesulfonate/hydrogen α,α'-dimethylsuccinate (1.4/5.6/93.6), N.E.=191; and

(37) Acidic polyvinyl ethers, including both carboxy and sulfoethers, with neutral ester and/or acetal and/or free hydroxyl groups, e.g., polyvinyl alcohol/acetate-β-carboxyethyl ether (15/45/40), N.E.=290; polyvinyl acetate/carboxymethyl ether (75/25), N.E.=410; polyvinyl acetate/formal/β-carboxyethyl ether (40/15/45), N.E.=259; polyvinyl alcohol/acetate/β-sulfoethyl ether (10/70/20), N.E.=760.

As will be apparent from the foregoing, there are three possible interrelated variables in the polyvinyl alcohol components, namely, (*a*) The percent of free hydroxyl groups, i.e., the percent unsubstituted.

(*b*) The percent of neutral substituents, i.e., the percent of hydroxyls substituted with neutral ester and/or ether groups, and (*c*) The percent of acidic substituents or salts thereof, i.e., the percent of hydroxyls substituted through ester and/or ether linkages with side chains carrying free acid, e.g., carboxyl and/or sulfonic, groups or the soluble salts thereof.

Since these three variables must total 100% based on the polyvinyl alcohol total hydroxyls, the situation exists where three interrelated variables must total a constant. Accordingly, this permits graphical presentation of these data in a standard triangular plot.

In the Fig. 1 of combined vinyl alcohol units with the drawing, percent of unsubstituted hydroxyls is plotted vertically in increasing amount on the scale running from *c* in the middle of side AB to apex C, i.e., *c*C. Similarly, percent of combined vinyl alcohol units carrying neutral substituents is plotted in increasing order on the axis *b*B, running from the middle of side AC to apex B, and percent of combined vinyl alcohol units carrying acid substituents or salts thereof is plotted in increasing order along the axis *a*A running from the middle of side BC to apex A. In this figure the plotted numerically legended points correspond to the so-numbered entries in preceding Table II. The plotted points legended with both numbers and letters correspond to the so-legended polymers disclosed in the section just preceding. It will be seen that the polymer components of these new compositions fall within the rhomboid area XYZW.

Figure 2:
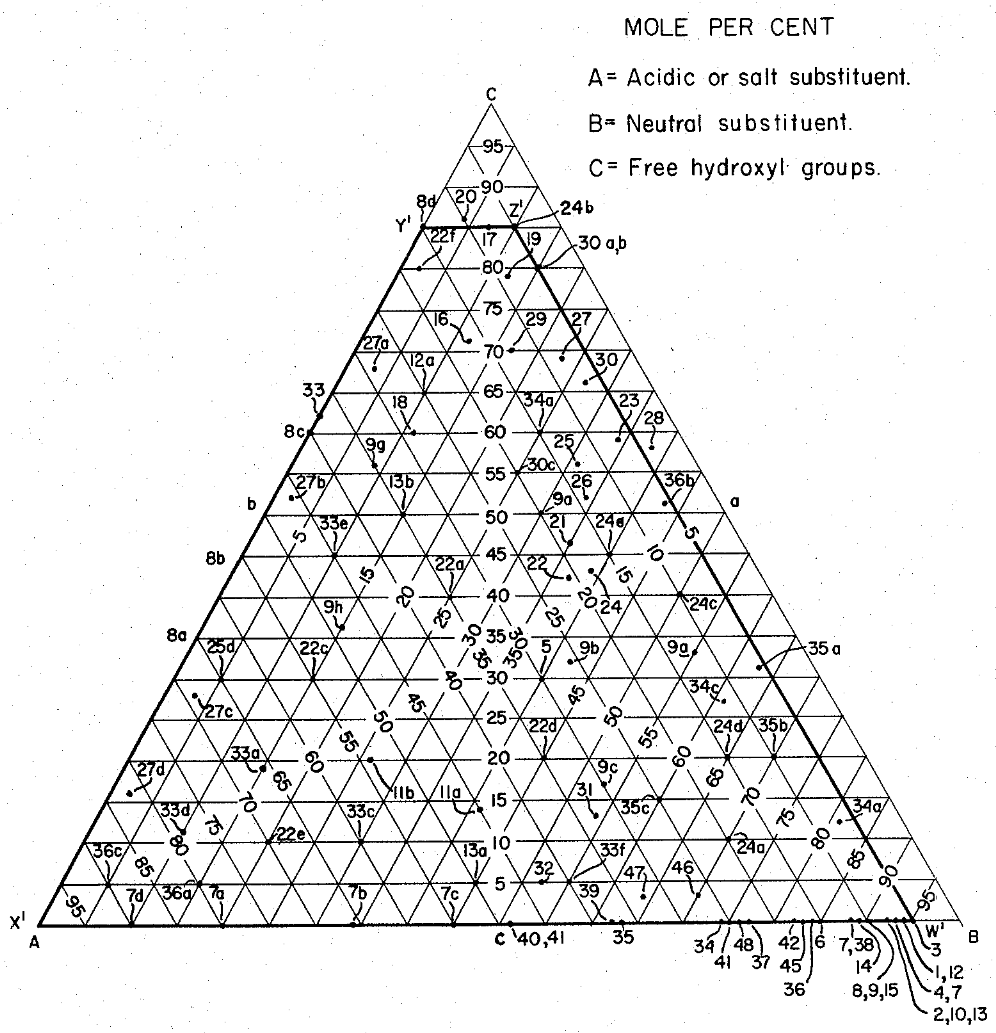
Fig. 2 is a similar graph in terms of mole percent.
Figure 3:
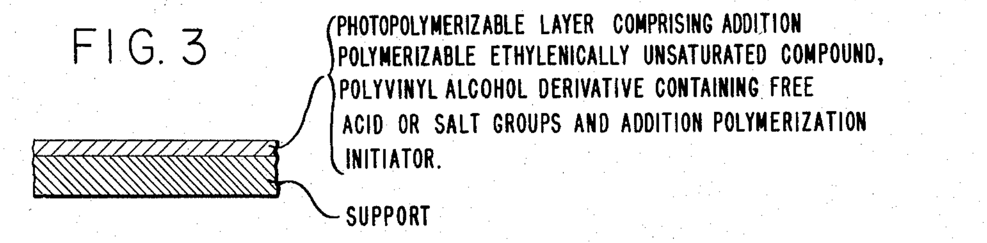
Fig. 3 is a vertical cross-sectional view of one type of photopolymerizable element of the invention.
Figure 4:
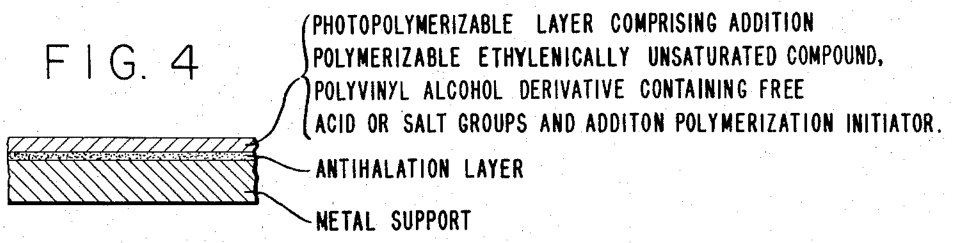
Fig. 4 is a vertical cross-sectional view of an alternative photopolymerizable element.
Figure 5:
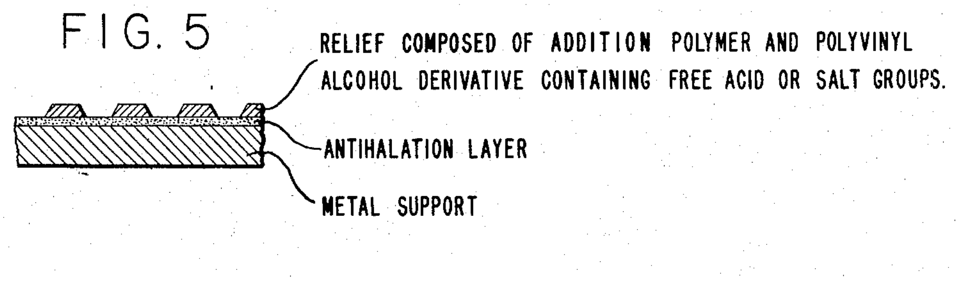
Fig. 5 is a vertical cross-sectional view of a portion of a printing relief made by practicing the process of this invention.

Fig. 1 shows the polymer components in terms of weight percent of the three variables. Fig. 2 attached presents the same data plotted in like manner along the same axis in terms of mole percent rather than weight percent. The same legends are used and the plotted points correspond respectively to the same polymer components appearing on Fig. 1. The polymer components of these new compositions are defined by the rhomboid area X'Y'Z'W'.

Because of their availability and processability, the preferred acidic polyvinyl alcohol components of the new compositions of this invention are those with a neutral equivalent (N.E.) of 115–2000, and preferably from about 200–1400, wherein any neutral substituents are linked to the main chain through ether or ester linkages and contain generally no more than about 7 chain carbons and most preferably no more than about 4 chain carbons in the neutral side chain. Generally speaking, greater chain length can be tolerated in acetal substituents than in simple ether or ester substituents. The solubilizing groups are free carboxylic or sulfonic acid groups, or the soluble salts thereof, i.e., the alkali metal, ammonium and substituted ammonium salts thereof, and are linked to the main polyvinyl alcohol chain through ester or ether groups. In the case of those linked through the former, there will generally be no more than about three chain atoms in the shortest chain linking the group to the main polymer chain and most preferably no more than about two such chain atoms per solubilizing substituent which chain atoms are most preferably solely carbon. In the case of the solubilizing groups linked to the main polymer chain through acetal linkages, longer chains can be tolerated and in some instances are advantageous. Generally speaking, the solubilizing groups linked through acetal linkages will contain no more than about seven chain atoms in the shortest chain linking the group to the main polymer chain, and most preferably no more than about four such chain atoms per such substituents. Particularly useful acidic polyvinyl alcohol derivatives, as just defined, are those having free carboxylic acid groups, or the soluble salts of sulfonic acid groups, preferably the former.

In the above discussion of the solubilizing groups and the length of chain linking said groups to the main polymer chain, the atoms of the solubilizing groups and of the functional linkage to the main polymer chain are not counted. For example, in a free carboxyl-containing chain linked to the main chain through a carboxyester linkage, the terminal carboxyl group and the linking carboxyester, i.e., —CO—O—, group are not counted in considering the length of the side chain. In the above defined groups in terms of numbers of chain carbons, an aliphatic carbon is counted as a single unit in a chain; whereas, a ring structure in the chain is counted as about two chain carbons rather than the total of all the ring atoms. For example, a polyvinyl butyrate/hydrogen phthalate has neutral carboxyester substituents containing four chain carbons and acidic carboxylic acid substituents containing about two chain carbons. A ring confers far less chain length character to these substituents than that indicated by the total number of ring members. More specifically, a hydrogen succinate and a hydrogen phthalate, and a propionate and a benzoate are about equivalent carboxylic acid and neutral carboxylic acid ester substituents, respectively: whereas, a hydrogen succinate and a hydrogen adipate and a propionate and a caproate are not equivalent such substituents. Similarly, a propional and benzal are about equivalent acetal substituents; whereas, a propional and an n-heptal are not equivalent.

These various acid substituted polyvinyl alcohol derivatives are well known in the art and can conveniently be made by well known etherification including acetalization or esterification reactions on polyvinyl alcohol or the simple polyvinyl alcohol acetals or esters as defined before. Certain acidic polyvinyl ethers can be made from polyvinyl alcohol and functionally substituted reactive ethylenically unsaturated compounds, e.g., acrylic acid or acrylonitrile followed by hydrolysis (U.S. 2,341,553) to give the β-carboxyethyl ether substituted polyvinyl alcohols. See, for instance, U.S. Patents 2,310,943, 2,324,426, and 2,705,226.

The most preferred compositions are based on polyvinyl alcohol derivatives, as above, wherein the lateral base-solubilizing groups are free oxyacid groups and wherein the majority of the polyvinyl alcohol hydroxyls are involved in acetal and/or ester linkages. The most outstanding are polyvinyl acetal/hydrogen dicarboxylates, polyvinyl ester/acetal/hydrogen dicarboxylates, and polyvinyl alcohol/acetal/hydrogen dicarboxylates, having less than 10% free alcoholic hydroxyls. The most outstanding species are those wherein the acetal groups are formal groups and the hydrogen dicarboxylate groups are those of aromatic dicarboxylic acids, particularly the hydrogen phthalates. Thus, specific most preferred compositions include the polyvinyl formal/hydrogen phthalates, as above, the polyvinyl acetate/formal/hydrogen phthalates and the polyvinyl alcohol/formal/hydrogen phthalates, with less than 10% alcoholic hydroxyls.

The aliphatic dicarboxylates are also quite good in the various respects and particularly outstanding among these are the hydrogen succinates and hydrogen maleates, all as above.

These most preferred compositions are outstanding, particularly in combination with the low molecular weight polymerizable components for use in the preparation of photopolymerizable layers for use in preparing printing reliefs since the photopolymerizable layers based thereon are drier, harder, stronger, tougher, and more readily processed. Furthermore, these compositions once polymerized and developed form stronger, tougher, harder, and higher melting printing reliefs. Furthermore, these polymer components are especially outstanding since they tolerate greater quantities of the low molecular weight polymerizable constituents and particularly they are highly compatible with the preferred low molecular weight ester components. The polymers, with lateral aromatic dicarboxylate structures, are preferred.

Like the above-described acid-substituted polyvinyl alcohol derivative, the low molecular weight addition polymerizable component of the new compositions of this invention is similarly narrowly and precisely selected and defined, both as to its nature and as to the quantity thereof which can be present in these new compositions. In the first place, there must be at least 10% of this addition polymerizable component, which preferably carries a plurality of addition polymerizable ethylenic linkages. Compositions containing smaller quantities insolubilize too slowly on light exposure or else insufficiently to permit adequate and proper development of the printing relief image. On the other hand, compositions like those of this invention but containing more than about 60% by weight of the composition of this low molecular weight addition polymerizable component are likewise unsatisfactory for making printing reliefs in that at these higher levels the low molecular weight, unsaturated, addition polymerizable component is either incompatible with the acidic polyvinyl alcohol derivative, or else, if compatible due to the concomitant solubilizing or plasticizing action on the acidic polyvinyl alcohol derivative, the resulting compositions are soft and tacky and therefore difficult to use by normal handling techniques for the preparation of relief printing plates.

Because of the more rapid insolubilization in shorter exposure times it is desirable to include in the new compositions of this invention as much of this low molecular weight addition polymerizable component as is possible consonant with the achievement of the firm, non-tacky, solid layers desired for use in preparation of relief printing plates. Generally speaking, this addition polymerizable component will preferably be present in amounts of from 20 to 40% based on the composition as a whole.

This low molecular weight addition polymerizable component should have a minimum boiling point of 100° C. at atmospheric pressure and furthermore must form with the acidic polyvinyl alcohol derivative a substantially homogeneous and transparent composition. Furthermore, the low molecular weight addition polymerizable component must be compatible with the acidic polyvinyl alcohol derivative and the photo-initiator and preferably should have a plasticizing or solvent action for either or both, especially the former, particularly at elevated temperatures. Generally speaking, this addition polymerizable component will range from 100 to no greater than about 1500 in molecular weight since materials within this range exhibit the best plasticizing or solubilizing action for the acidic polyvinyl alcohol derivatives and accordingly permit fabrication of the desired layers of the new compositions of this invention by conventionally used extrusion or milling techniques. The polymerizable component should contain at least one polymerizable ethylenic linkage for every 300 units of molecular weight. The preferred polymerizable components range in molecular weight from about 150 to about 500 and have at least one addition polymerizable ethylenic linkage for each about 100–250 units of molecular weight since such exhibit greater plasticizing action on the acidic polyvinyl alcohol derivatives and on exposure polymerize more rapidly to somewhat more insoluble polymers.

Chemically this low molecular weight addition polymerizable component should be free of basic groups capable of interaction with the acidic polyvinyl alcohol component with the acidic substituents in either and/or both the free acid or salt form. Desirably, this addition polymerizable component should have at least one terminal vinylidene group per molecule.

Suitable specific such components, in addition to those given in the examples, include selected esters of α-methylene carboxylic acids, e.g., methyl methacrylate, diethylene glycol acrylate, and the like; selected olefin blends with ethylenic α,β-dicarboxylic acid or esters thereof, e.g., styrene/diethyl fumarate, styrene/diethyl maleate blends; esters of vinyl benzoic acid, e.g., methyl vinylbenzoate, β-hydroxyethyl vinylbenzoate; neutral α-methylenecarboxylic acid esters and/or amides of primary and secondary amino alcohols, such as the acrylates, methacrylates, acrylamides and methacrylamides, e.g., N(β-hydroxyethyl)methacrylamide, N,N-bis(β-hydroxyethyl)-acrylamide, β-acetamidoethyl methacrylate, and β-methacrylamidoethyl propionate.

Because of a more rapid rate of insolubilization on exposure, presumably due to a relatively rapid establishment of a network polymer structure, an outstanding class of the low molecular weight addition polymerizable components is that wherein the components have a plurality of addition polymerizable ethylenic linkages, preferably terminal linkages. Preferred compounds are those wherein at least one and preferably most of such linkages are conjugated with a doubly bonded carbon, including carbon doubly bonded to carbon or to such heteroatoms as nitrogen, oxygen, and sulfur. Particularly useful are such materials wherein the ethylenically unsaturated groups, especially the vinylidene groups, are conjugated with ester or amide structure. The following specific compounds are further illustrative of this class: unsaturated esters of polyols, particularly such esters of the α-methylene carboxylic acids, e.g., ethylene diacrylate, diethylene glycol diacrylate, glycerol diacrylate, glycerol triacrylate, ethylene dimethacrylate, 1,3-propylene dimethacrylate, 1,4-cyclohexanediol diacrylate, 1,4-benzenediol dimethacrylate, pentaerythritol tetramethacrylate, 1,3-propylene glycol diacrylate, 1,5-pentanediol dimethacrylate, the bis-acrylates and methacrylates of polyethylene glycols of molecular weight 200–500; unsaturated amides, particularly those of the α-methylene carboxylic acids, and especially those of alpha,omega-diamines and oxygen-interrupted omega-diamines, such as methylene bis-acrylamide, methylene bis-methacrylamide, ethylene bis-methacrylamide, 1,6-hexamethylene bis-acrylamide and diethylene triamine tris-methacrylamide; vinyl esters such as divinyl succinate, divinyl adipate, divinyl phthalate, divinyl terephthalate, divinyl benzene-1,3-disulfonate and divinyl butane-1,4-disulfonate; unsaturated aldehydes, such as sorbaldehyde, i.e., 2,4-hexadienal; the neutral α-methylenecarboxylic acid polyesters, polyamides, and/or esteramides of primary and secondary aminoalcohols, aminopolyols, or polyaminoalcohols or polyols, such as the acrylates, methacrylates, acrylamides and methacrylamides, and the like derivatives of such alcohols, e.g., β-methacrylamidoethyl methacrylate, N-(β-hydroxyethyl)-β-(methacrylamido)ethyl acrylate, N,N-bis(β-methacrylyloxyethyl)acrylamide. Preferred addition polymerizable components are the esters and amides of α-methylene carboxylic acids and substituted carboxylic acids with polyols and polyamines wherein the molecular chain between the hydroxyls and amino groups is solely carbon or oxygen-interrupted carbon.

The ethylenically unsaturated addition polymerizable compounds described in the foregoing three paragraphs and in the examples and elsewhere in this application are normally non-gaseous compounds, that is, they are liquids or solids at normal temperatures and pressures. In addition, they readily form addition polymers of high molecular weight by photoinitiated addition polymerization, i.e., in the presence of an addition polymerization initiator therefor activatable by actinic light.

In addition to the aforesaid components or mixtures thereof, the photopolymerizable layer can also contain added preformed compatible condensation or addition polymers as well as immiscible polymeric or nonpolymeric, organic or inorganic fillers or reinforcing agents which form essentially transparent compositions, e.g., the organophilic silicas, the bentonites, silica, powdered glass, and the like, having a particle size less than 0.4 mil in their maximum dimension, and in amounts varying with the desired properties of the photopolymerizable layer.

Suitable preformed compatible polymers include the addition polymers generally, including specifically vinyl ester polymers and copolymers, polyvinyl alcohol, polyvinyl acetate, polyvinyl butyrate, polyvinyl acetals, e.g., polyvinyl butyral and polyvinyl formal. Suitable compatible condensation polymers include both saturated and unsaturated types, such as the alkyd polymers, e.g., polyglycerol phthalate and polyglycerol maleate. The addition polymers can also be unsaturated, e.g., the polyvinyl alcohol esters of unsaturated acids and acetals of unsaturated aldehydes, such as, polyvinyl sorbate and polyvinyl sorbal. These added substituents can be present in all the compositions but are generally only used in those compositions having a relatively high percentage of the low molecular weight polymerizable component. In such compositions, these added fillers confer greater solidity and decrease any tendencies towards plastic flow or tackiness. Since the acidic polyvinyl alcohol components are solids, the compositions containing low to medium proportions of the low molecular weight addition polymerizable component are also solids and generally need no added filler. However, in some instances where cost is the controlling factor, it will be economical to substitute varying proportions of the above fillers for the acidic polyvinyl alcohol component consonant with retention of the desired aqueous base developability. Usually, even in compositions containing high proportions of low molecular weight polymerizable component, fillers will not be used in amounts exceeding about 10–40% by weight of the whole composition.

These added constituents can be present in all the foregoing compositions in order to modify their rheological properties, render the photopolymerizable layers even more tack-free, and make the compositions more readily formable into sheets. Since a stiff sheet can be more easily handled in a forming operation, e.g., in preparing a photopolymerizable plate for use in making a printing plate, the use of filler materials giving the requisite stiffness has important commercial advantages.

Mixtures of two, three or more of the foregoing compatible polymers and/or fillers can be used in the photopolymerizable compositions but in general the fillers should not be present in amounts exceeding about 40% by weight of the whole composition. Moreover, with polymeric fillers, amounts up to about 20% by weight of the whole give the best results.

Inert relatively non-volatile liquid plasticizers, e.g., triacetin, bis-(acetamidopropoxy)ethane, can be present, e.g., when the composition is too stiff or when low amounts of monomer, e.g., 10–15% by weight of the whole, are present.

As stated previously, these new compositions after exposure can be developed to desirable printing reliefs with water or aqueous bases. Water-development will usually be used with compositions based on the water-soluble polyvinyl alcohol acid salts, i.e., the salts with alkali metals, ammonia, or substituted ammonium hydroxide or amines, i.e., of the polyvinyl alcohol derivatives having lateral free carboxylic acid or sulfonic acid groups.

Water development will also be used with compositions based on the water-soluble free acid, especially carboxyl, polymers although aqueous base development can be used and will generally be faster. This latter class of polymers is characterized by at least 50 mole percent free hydroxyls for short chain neutral and/or acid substituents, e.g., a polyvinyl alcohol/acetal/acetate/hydrogen maleate, increasing to 80 mole percent or higher as the chain length of either or both the acidic or neutral substituents increases, e.g., 80 mole percent hydroxyl for a polyvinyl alcohol/acetate/hydrogen dodecenylsuccinate, and the like.

For compositions based on the preferred water insoluble free acid polymers, especially the carboxyl polymers, development will be carried out with aqueous bases, i.e., aqueous solutions of water-soluble bases in concentrations generally in the range from 0.01% to 10% by weight. Higher concentrations of course can be used, but no improved result is obtained thereby. Depending upon the organic/aqueous base partition solution coefficient of the acidic polyvinyl alcohol derivatives, minor amounts of compatible organic solvents will frequently be found to be efficacious in the development medium, such as: the short chain alcohols, e.g., methyl and ethyl alcohol; the ketones, e.g., acetone, ethylmethyl ketone and cyclohexanone.

Suitable bases for the latter class of development include the alkali metal hydroxides, e.g., lithium, sodium, and potassium hydroxide; the base-reacting alkali metal salts of weak acids, e.g., lithium, sodium, and potassium carbonates and bicarbonates; amines having a base-ionization constant greater than about $1\times10^{-6}$, e.g., primary amines, e.g., benzyl, butyl, allyl amines, and the like; secondary amines, e.g., dimethylamine and benzyl methyl amine; tertiary amines, e.g., trimethylamine, and triethylamine; primary, secondary, and tertiary hydroxyamines, e.g., propanol, diethanol and triethanol amines, and 2-amino-2-hydroxymethyl-1,3-propanediol, cyclic amines, e.g., morpholine, piperidine, piperazine, pyrrolidine, and pyridine; polyamines, such as hydrazine, ethylene and hexamethylene amines; the water-soluble, base-reacting salts, e.g., the carbonates and bicarbonates of the above amines; ammonium hydroxide and tetrahydrocarbon-substituted ammonium hydroxides, e.g., tetramethyl-, tetraethyl-, trimethylbenzyl-, and trimethylphenylammonium hydroxides; sulfonium hydroxides, e.g., trimethyl-, diethylmethyl-, dimethylbenzylsulfonium hydroxides, and the base-reacting soluble salts thereof, e.g., the carbonates, bicarbonates and sulfides; alkali metal phosphates and pyrophosphates, e.g., sodium and potassium triphosphates and sodium and potassium pyrophosphates; tetra-substituted (preferably wholly alkyl) phosphonium, arsonium, and stibonium hydroxide, e.g., tetramethylphosphonium hydroxide. For reasons of greater availability, ease in handling and low costs, the preferred bases are the alkali metal hydroxides, particularly sodium and potassium hydroxides; ammonium hydroxide; the alkali metal base-reacting salts of weak acids, especially sodium and potassium bicarbonate, and carbonate; and the hydroxyamines.

The photoinitiator, i.e., addition polymerization catalyst (or preferably initiator) activatable by actinic light, must be compatible with both the acidic polyvinyl alcohol derivative and the addition polymerizable component as well as any added organic or inorganic fillers, and preferably is soluble in the low molecular weight polymerizable component. In any event, it must be capable of being substantially completely homogeneously distributed throughout the new compositions of this invention. In the second place, since most useful light sources give off both heat and light and since heat is transmitted by the opaque and transparent areas of the image-bearing process transparencies used in the process, the free-radical generating, addition polymerization initiators should not be activatable thermally below about 85° C. This is also important because the polymerization generates heat, some of which is transmitted to areas of the compositions outside the exposed areas. In order to preserve ultimate fidelity of the printing image, such transmitted heat should not be permitted to initiate polymerization in the unexposed areas. Precautions can be taken to exclude to some extent heat rays emanating from the light source and to remove heat buildup caused by polymerization, so as to maintain the photopolymerizable layer at temperatures which are not effective in activating the initiator thermally. However, complete exclusion of input or generated heat makes necessary longer exposure times since the rate of chain propagation in the polymerization reaction is lower at reduced temperatures.

Thus, the free-radical generating addition polymerization initiators useful in these new compositions are those capable of initiating polymerization under the influence of actinic light which are dispersible in the aforesaid described acidic polyvinyl alcohol derivative/lower molecular weight polymerizable component compositions to the extent necessary for initiating the desired polymerization under the influence of the light energy available and which are not active thermally at temperatures below 80–85° C. The preferred initiators are obviously those which are most rapidly affected by the light energy available in the shortest exposure times to initiate the greatest number of growing polymer chains. These photopolymerization initiators are generally used in amounts of from 0.01 to 5.0% and preferably from 0.1 to 2.0%, based on the weight of the polymerizable component. Suitable such initiators include vicinal ketaldonyl compounds, such as diacetyl, benzil, etc.; α-ketaldonyl alcohols, such as benzoin, pivaloin, etc.; acyloin ethers, such as benzoin methyl or ethyl ethers, etc.; α-hydrocarbon substituted aromatic acyloins, including α-methylbenzoin, α-allylbenzoin, and α-phenylbenzoin. The acyloin ethers are especially useful.

The commercial low molecular weight polymerizable components discussed previously, including both the mono- and polyethylenically unsaturated compounds, normally contain minor amounts (about 50–100 parts per million by weight) of polymerization inhibitors so as to prevent spontaneous polymerization before desired. The presence of these inhibitors, which are usually of the antioxidant type, e.g., hydroquinone, tertiary-butyl catechols, and tri-tertiary-butylphenol in such amounts causes no undesirable results in the photopolymerizable layers of this invention, either as to speed or quality of polymerization. In fact, larger quantities of such inhibitors, e.g., of the order of 200–500 parts per million can be tolerated and tend to reduce unwanted polymerization in non-exposed, i.e., non-image, areas.

The photopolymerizable compositions of this invention are not limited in use to the preparation of printing reliefs. They are useful for making shaped articles of various kinds. They can be used for making very thin reliefs, e.g., in the order of one micron. The compositions can be used for making multicolor television screens by the procedures taught in assignee's Swindells application Ser. No. 373,753, filed August 12, 1953.

An advantage of the compositions is that they are readily soluble in aqueous processing solutions and can be readily removed from layers containing polymerized areas. The use of aqueous solutions which are low in cost and non-toxic have obvious economic advantages. Moreover, aqueous processing eliminates expensive solvent recovery equipment. A further advantage is that printing reliefs made in accordance with the invention are not deleteriously affected by the conventional printing inks and printing plate cleaning solutions.

Polymerizable layers made from the compositions, due to the high degree of compatibility between the components thereof, are firm, have substantially tack-free surfaces, exhibit no exudation and result in printing reliefs of the highest quality.

What is claimed is:

1. A photopolymerizable composition comprising (1) a normally non-gaseous, addition polymerizable, ethylenically unsaturated compound having a normal boiling point greater than 100° C. at atmospheric pressure, having a molecular weight from about 100 to about 1500, containing at least one addition polymerizable ethylenic linkage for each 300 units of molecular weight, and being capable of forming a high polymer by photo-initiated addition polymerization in the presence of an addition polymerization initiator therefor activatable by actinic light; (2) a polyvinyl alcohol derivative having a molecular weight greater than 10,000 taken from the group consisting of polyvinyl esters of mono-substituted acids, polyvinyl ethers of monosubstituted alcohols, polyvinyl acetals of monosubstituted aldehydes and such derivatives containing more than one type of the ester, ether and acetal groups, said derivative being further characterized in that said mono-substituted acids, ethers and aldehydes contain not more than seven carbon atoms, and the substituent of said mono-substituted compounds is taken from the class consisting of free oxyacid groups and alkali metal, ammonium and amine salts thereof, and said derivatives are soluble to the extent of at least 10% by weight in 2% aqueous ammonia solution, and in free acid form have a neutralization equivalent from about 115 to about 2500 and contain within the weight percent limits represented by the area X, Y, Z, W in Fig. 1 of the drawing combined vinyl alcohol units carrying the aforesaid oxyacid groups, combined vinyl alcohol units with unsubstituted hydroxyls, and combined vinyl alcohol units carrying lateral neutral groups in respective amounts to satisfy the weight percent limits called for in the same said area X, Y, Z, W; and (3) polymerization-effective amounts of an addition polymerization initiator activatable by actinic light and thermally inactive below 85° C.

2. A composition as set forth in claim 1 containing up to 40% by weight of an inert compatible filler material, said composition being essentially transparent to actinic light.

3. A composition as set forth in claim 1 wherein said unsaturated compound is an acrylic diester of a polyethylene glycol.

4. A composition as set forth in claim 1 wherein said polyvinyl alcohol derivative is a polyvinyl acetal.

5. A composition as set forth in claim 1 wherein said polyvinyl alcohol derivative is a polyvinyl acetal/hydrogen dicarboxylate.

6. A composition as set forth in claim 1 wherein said polyvinyl derivative contains lateral oxyacid groups and exhibits a neutral equivalent of 115–2000.

7. A composition as set forth in claim 1 wherein said polyvinyl alcohol derivative is a polyvinyl ester/acetal/hydrogen dicarboxylate.

8. A composition as set forth in claim 1 wherein said polyvinyl derivative is a polyvinyl formal/hydrogen phthalate.

9. A photopolymerizable element comprising (*a*) a support and (*b*) a relief height-forming stratum comprising (1) a normally non-gaseous, addition polymerizable, ethylenically unsaturated compound having a normal boiling point greater than 100° C. at atmospheric pressure, having a molecular weight from about 100 to about 1500, containing at least one addition polymerizable ethylenic linkage for each 300 units of molecular weight, and being capable of forming a high polymer by photoinitiated addition polymerization in the presence of an addition polymerization initiator therefor activatable by actinic light; (2) a polyvinyl alcohol derivative having a molecular weight greater than 10,000 taken from the group consisting of polyvinyl esters of mono-substituted acids, polyvinyl ethers of mono-substituted alcohols, polyvinyl acetals of monosubstituted aldehydes and such derivatives containing more than one type of the ester, ether and acetal groups, said derivative being further characterized in that said mono-substituted acids, ethers and aldehydes contain not more than seven carbon atoms, and the substituent of said mono-substituted compounds is taken from the class consisting of free oxyacid groups and alkali metal, ammonium and amine salts thereof, and said derivatives are soluble to the extent of at least 10% by weight in 2% aqueous ammonia solution, in free acid form have a neutralization equivalent from about 115 to 2500 and contain within the weight percent limits represented by the area X, Y, Z, W in Fig. 1 of the drawing combined vinyl alcohol units carrying the aforesaid oxyacid groups, combined vinyl alcohol units with unsubstituted hydroxyls, and combined vinyl alcohol units carrying lateral neutral groups in respective amounts to satisfy the weight percent limits called for in the same said area X, Y, Z, W; and (3) polymerization-effective amounts of an addition polymerization initiator activatable by actinic light and thermally inactive below 85° C., said relief height-forming stratum having an optical density less than 5.0 and less than 0.5 per mil to said actinic light.

10. A photopolymerizable element as set forth in claim 9 wherein said layer is 3 to 250 mils in thickness.

11. A photopolymerizable element as set forth in claim 9 wherein said base is a metal and there is an antihalation material beneath said layer.

12. A photopolymerizable element as set forth in claim 9 wherein said layer contains inert filler material in an amount up to 40% by weight of the total composition.

13. A photopolymerizable element as set forth in claim 9 wherein said unsaturated compound is a monomer containing at least two terminal ethylenic groups.

14. A photopolymerizable element as set forth in claim 9 wherein said unsaturated compound is an acrylic acid diester of a polyethylene glycol.

15. The process of making a relief which comprises exposing to actinic light selected portions of a photopolymerizable element as set forth in claim 11 until the composition in the exposed areas is polymerized to the insoluble state to the desired depth, and removing the unexposed portions of the said layer by means of an aqueous developer solution taken from the group consisting of neutral and alkaline solutions.

16. The process of making a printing relief which comprises exposing to actinic light through a transparency having light-opaque areas and transparent areas, a photopolymerizable element as set forth in claim 11 until the composition in the exposed areas is polymerized to the insoluble state to the desired depth without exposure in the unexposed areas and removing the unexposed portions of said layer by means of an aqueous developer solution taken from the group consisting of neutral and alkaline solutions.

17. A printing relief obtained by the process of claim 16.

References Cited in the file of this patent

UNITED STATES PATENTS

| | | |
|---|---|---|
| 2,367,661 | Agre | Jan. 23, 1945 |
| 2,413,275 | Wilson et al. | Dec. 24, 1946 |
| 2,760,863 | Plambeck | Aug. 28, 1956 |
| 2,787,546 | Smith et al. | Apr. 2, 1957 |

FOREIGN PATENTS

| | | |
|---|---|---|
| 566,795 | Great Britain | Jan. 15, 1945 |
| 618,181 | Great Britain | Feb. 17, 1949 |
| 525,225 | Belgium | June 19, 1954 |